(12) United States Patent
Jang et al.

(10) Patent No.: US 11,923,381 B2
(45) Date of Patent: Mar. 5, 2024

(54) DISPLAY DEVICE WITH AUXILIARY BOTTOM LINE

(71) Applicant: Samsung Display Co., LTD., Yongin-si (KR)

(72) Inventors: Jae Yong Jang, Yongin-si (KR); Sun Hwa Lee, Yongin-si (KR); Bon Yong Koo, Yongin-si (KR); Su Jin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/945,183

(22) Filed: Sep. 15, 2022

(65) Prior Publication Data

US 2023/0116832 A1 Apr. 13, 2023

(30) Foreign Application Priority Data

Oct. 7, 2021 (KR) ........................ 10-2021-0133440

(51) Int. Cl.
*G09G 3/3233* (2016.01)
*H01L 25/16* (2023.01)
*H01L 27/12* (2006.01)

(52) U.S. Cl.
CPC ....... *H01L 27/1255* (2013.01); *G09G 3/3233* (2013.01); *H01L 25/167* (2013.01); *G09G 2300/0426* (2013.01); *G09G 2300/0819* (2013.01); *G09G 2300/0852* (2013.01); *G09G 2300/0861* (2013.01); *G09G 2310/0278* (2013.01)

(58) Field of Classification Search
CPC ......... G09G 3/3233; G09G 2300/0426; G09G 2300/0819; G09G 2300/0852; G09G 2300/0861; H01L 27/1255
See application file for complete search history.

(56) References Cited

U.S. PATENT DOCUMENTS

2018/0069126 A1* 3/2018 Sasaki ................ H01L 27/1225
2018/0294328 A1* 10/2018 Kanaya ................ H10K 59/131
(Continued)

FOREIGN PATENT DOCUMENTS

KR 10-2022-0149884 11/2022
WO WO-2020017722 A1 * 1/2020 ......... H01L 25/0753

*Primary Examiner* — Yuzhen Shen
(74) *Attorney, Agent, or Firm* — KILE PARK REED & HOUTTEMAN PLLC

(57) ABSTRACT

A display device may include a first conductive layer disposed on a substrate, and including an auxiliary bottom line and an additional conductive pattern; a first insulating layer disposed on the substrate and the first conductive layer; a semiconductor pattern disposed on the first insulating layer; a second insulating layer disposed on the first insulating layer and the semiconductor pattern; a second conductive layer disposed on the second insulating layer, and including a conductive pattern and a gate electrode; a third insulating layer disposed on the second insulating layer and the second conductive layer; a connection pattern disposed on the third insulating layer and electrically connected to the conductive pattern; a first electrode disposed on the connection pattern and electrically connected to the connection pattern; and at least one light emitting element disposed on the first electrode and electrically connected to the first electrode.

21 Claims, 22 Drawing Sheets

(56) References Cited

U.S. PATENT DOCUMENTS

| | | | |
|---|---|---|---|
| 2021/0201778 A1* | 7/2021 | Kawachi | G09G 3/3233 |
| 2021/0320237 A1* | 10/2021 | Kim | H01L 25/0753 |
| 2022/0005994 A1* | 1/2022 | Morita | G09G 3/3233 |
| 2022/0230588 A1* | 7/2022 | Heganovic | G09G 3/3258 |
| 2022/0352131 A1 | 11/2022 | Choi et al. | |
| 2022/0398980 A1* | 12/2022 | Kawachi | G09G 3/3233 |

\* cited by examiner

DISPLAY DEVICE WITH AUXILIARY BOTTOM LINE

CROSS-REFERENCE TO RELATED APPLICATION(S)

The disclosure claims priority to and benefits of Korean patent application number 10-2021-0133440 under 35 U.S.C. § 119, filed on Oct. 7, 2021, in the Korean Intellectual Property Office (KIPO), the entire contents of which are incorporated herein by reference.

BACKGROUND

1. Technical Field

Various embodiments of the disclosure relates to a display device.

2. Description of Related Art

Recently, as interest in information display increases, research and development on display devices have been continuously conducted.

SUMMARY

Various embodiments of the disclosure are directed to a display device capable of reducing or minimizing a malfunction and/or emission error of a light emitting element which may be caused by leakage current.

A display device in accordance with an embodiment of the disclosure may include a first conductive layer disposed on a substrate, and including an auxiliary bottom line and an additional conductive pattern; a first insulating layer disposed on the substrate and the first conductive layer; a semiconductor pattern disposed on the first insulating layer; a second insulating layer disposed on the first insulating layer and the semiconductor pattern; a second conductive layer disposed on the second insulating layer, and including a conductive pattern and a gate electrode spaced apart from each other; a third insulating layer disposed on the second insulating layer and the second conductive layer; a connection pattern disposed on the third insulating layer and electrically connected to the conductive pattern through a contact hole passing through the third insulating layer; a first electrode disposed on the connection pattern and electrically connected to the connection pattern; and at least one light emitting element disposed on the first electrode and electrically connected to the first electrode.

In an embodiment, the conductive pattern may partially overlap the additional conductive pattern in a plan view, the first and the second insulating layers may be disposed between the conductive pattern and the additional conductive pattern, and the conductive pattern and the additional conductive pattern may form a first capacitor along with the additional conductive pattern.

In an embodiment, the additional conductive pattern may be a first electrode of the first capacitor. An overlap area of the conductive pattern that overlaps the additional conductive pattern in a plan view may be a second electrode of the first capacitor.

In an embodiment, a voltage may be applied to the additional conductive pattern.

In an embodiment, the display device may further include a third conductive layer including an upper electrode disposed on the third insulating layer such that the upper electrode is located on the gate electrode. The upper electrode partially may overlap the gate electrode in a plan view, the third insulating layer may be disposed between the upper electrode and the gate electrode, and the upper electrode and the gate electrode may form a storage capacitor.

In an embodiment, the gate electrode may be a first electrode of the storage capacitor. An overlap area of the upper electrode that overlaps the gate electrode in a plan view may be a second electrode of the storage capacitor.

In an embodiment, the upper electrode may not overlap the conductive pattern in a plan view.

In an embodiment, the upper electrode may partially overlap the conductive pattern in a plan view.

In an embodiment, the upper electrode may overlap the conductive pattern in a plan view, the third insulating layer may be disposed between the upper electrode and the conductive pattern, and the upper electrode and the conductive pattern may form a second capacitor.

In an embodiment, the conductive pattern may be a first electrode of the second capacitor. An overlap area of the upper electrode that overlaps the conductive pattern in a plan view may be a second electrode of the second capacitor.

In an embodiment, the additional conductive pattern and the auxiliary bottom line may be integral with each other.

In an embodiment, the additional conductive pattern and the auxiliary bottom line may be disposed on the substrate and spaced apart from each other.

In an embodiment, the conductive pattern may correspond to the additional conductive pattern. The gate electrode may correspond to the auxiliary bottom line.

In an embodiment, different voltages may be respectively applied to the additional conductive pattern and the auxiliary bottom line.

In an embodiment, the display device may further include a bank disposed on the first electrode and including an opening which exposes at least a portion of the first electrode; and a second electrode disposed on the light emitting element and electrically connected to the light emitting element.

In an embodiment, the display device may further include an intermediate layer disposed between the bank and the second electrode and in the opening. The intermediate layer may be an organic layer.

In an embodiment, the light emitting element may be a vertical light emitting diode including a first end and a second end in a longitudinal direction. The light emitting element may include a first semiconductor layer disposed at the first end and electrically connected to the first electrode; a second semiconductor layer disposed at the second end and electrically connected to the second electrode; and an active layer disposed between the first semiconductor layer and the second semiconductor layer. The first semiconductor layer may include a p-type semiconductor layer doped with a p-type dopant, and the second semiconductor layer comprises an n-type semiconductor layer doped with an n-type dopant.

A display device in accordance with an embodiment of the disclosure may include pixels provided on a substrate. Each of the pixels may include a pixel circuit layer disposed on the substrate, and including at least one transistor, and at least one power line electrically connected to the at least one transistor; and a display element layer disposed on the pixel circuit layer, and including a first electrode electrically connected to each of the at least one transistor and the at least one power line, and at least one light emitting element electrically connected to the first electrode.

The pixel circuit layer may include a first conductive layer disposed between the substrate and the at least one transistor, and including an auxiliary bottom line, and an additional conductive pattern that partially overlap the at least one transistor in a plan view; a first insulating layer disposed on the substrate and the first conductive layer; a semiconductor pattern of the at least one transistor disposed on the first insulating layer; a second insulating layer disposed on the first insulating layer and the semiconductor pattern of the at least one transistor; a second conductive layer disposed on the second insulating layer, and including a conductive pattern and a gate electrode spaced apart from each other; a third insulating layer disposed on the second insulating layer and the second conductive layer; a connection pattern disposed on the third insulating layer and electrically connected to the conductive pattern through a contact hole passing through the third insulating layer; and a bridge pattern disposed between the connection pattern and the first electrode, and electrically connecting the connection pattern to the first electrode.

In an embodiment, the conductive pattern may partially overlap the additional conductive pattern in a plan view, the first and the second insulating layers may be disposed between the conductive pattern and the additional conductive pattern, and the conductive pattern and the additional conductive pattern may form a capacitor.

The additional conductive pattern may form a first electrode of the capacitor. An overlap area of the conductive pattern that overlaps the additional conductive pattern in a plan view may form a second electrode of the capacitor.

A display device in accordance with an embodiment of the disclosure may include a data line; a scan line; a first driving voltage line and a second driving voltage line; an emission control line; an auxiliary bottom line; a first transistor comprising a gate electrode electrically connected to a first node, a first electrode electrically connected to a second node, a second electrode electrically connected to a third node; a second transistor comprising a first electrode electrically connected to the data line, a second electrode electrically connected to the second node, and a gate electrode electrically connected to the scan line; a first capacitor electrically connected between the first node and the first driving voltage line; a third transistor comprising a first electrode electrically connected to the third node, a second electrode electrically connected to a fourth node, and a gate electrode electrically connected to the emission control line; at least one light emitting element electrically connected between the fourth node and the second driving voltage line; and a second capacitor electrically connected between the fourth node and the auxiliary bottom line. A voltage is applied to the auxiliary bottom line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
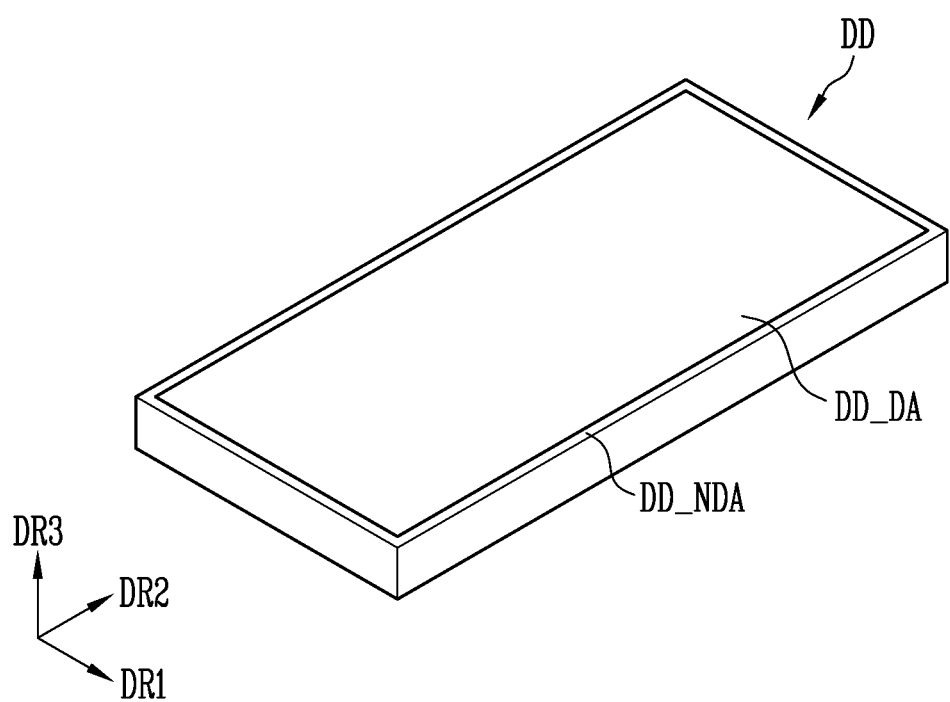
FIG. 1 is a perspective view schematically illustrating a display device in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Embodiments and required details of the disclosure are described with reference to the accompanying drawings in order to describe the disclosure in detail so that those having ordinary knowledge in the technical field to which the disclosure pertains may easily practice the disclosure. Furthermore, a singular form may include a plural form as long as it is not specifically mentioned in a sentence.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
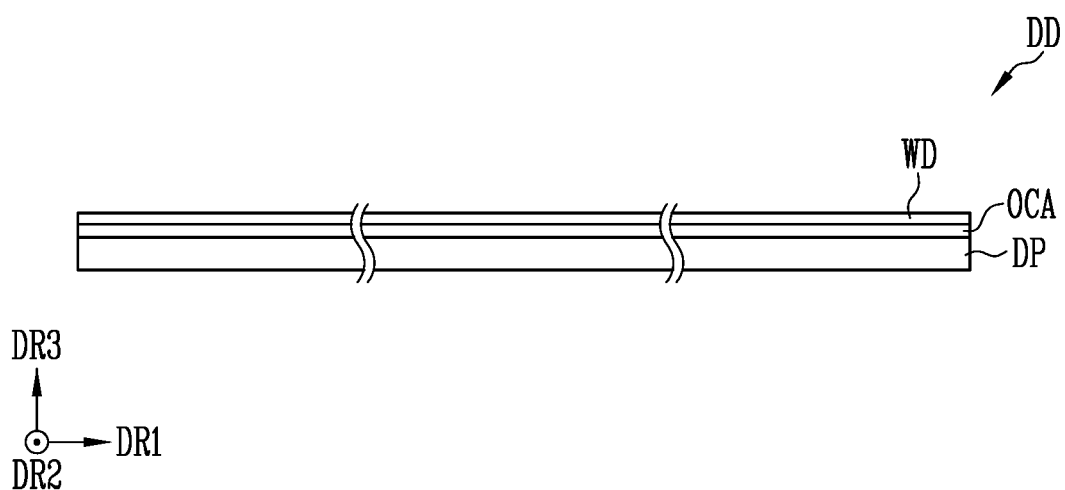
FIG. 2 is a cross-sectional view schematically illustrating the display device of FIG. 1.
Figure 3:
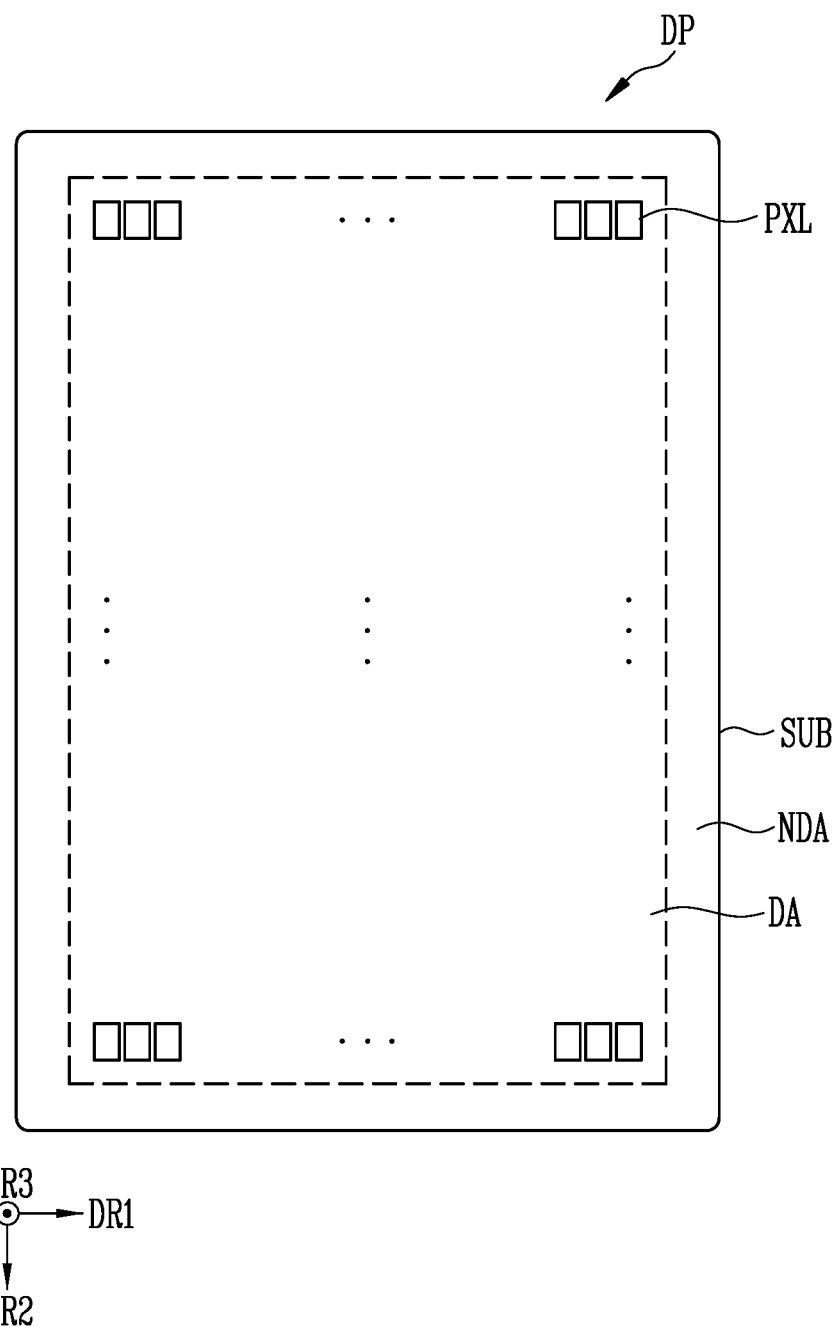
FIG. 3 is a plan view schematically illustrating a display panel in accordance with an embodiment of the disclosure.
Figure 4:
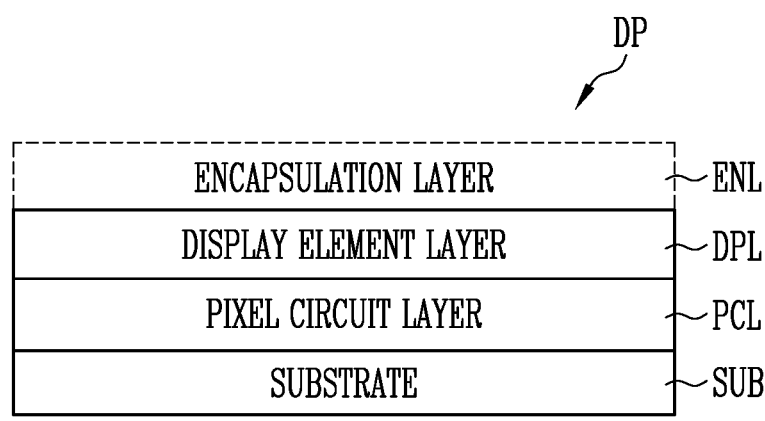
FIG. 4 is a cross-sectional view schematically illustrating a display panel in accordance with an embodiment of the disclosure.

FIG. 1 is a perspective view schematically illustrating a display device DD in accordance with an embodiment of the disclosure. FIG. 2 is a cross-sectional view schematically illustrating the display device DD of FIG. 1. FIG. 3 is a plan view schematically illustrating a display panel DP in accordance with an embodiment of the disclosure. FIG. 4 is a cross-sectional view schematically illustrating a display panel DP in accordance with an embodiment of the disclosure.

Referring to FIGS. 1 to 4, the display device DD may include the display panel DP and a window WD.

If the display device DD is an electronic device having a display surface as at least one surface thereof, e.g., a smartphone, a television, a tablet personal computer (PC), a mobile phone, a video phone, an electronic-book reader, a desktop PC, a laptop PC, a netbook computer, a workstation, a server, a personal digital assistant (PDA), a portable multimedia player (PMP), an MP3 player, a medical appliance, a camera, or a wearable device, the disclosure may be applied to the display device DD.

The display device DD may be provided in various forms, for example, in the form of a rectangular plate having two pairs of parallel sides, but the disclosure is not limited thereto. In case that the display device DD is provided in the form of a rectangular plate, one of the two pairs of sides thereof may be longer than the other thereof. Although FIG. 1 illustrates that the display device DD has an angled corner formed by linear lines, the disclosure is not limited thereto. In an embodiment, in the display device DD provided in the form of a rectangular plate, a corner where a long side and a short side meet each other may have a rounded shape.

In an embodiment, for the sake of explanation, there is illustrated an example in which the display device DD has a rectangular shape with a pair of long sides and a pair of short sides. A direction in which the long sides extend refers to a second direction DR2, a direction in which the short sides extend refers to a first direction DR1, and a direction (or a thickness-wise direction of the display device DD) perpendicular to the directions in which the long sides and the short sides extend refers to a third direction DR3.

In an embodiment, at least a portion of the display device DD may have flexibility, and may be folded.

The display device DD may include a display area DD_DA provided to display an image, and a non-display area DD_NDA disposed at at least one side of the display area DD_DA. The non-display area DD_NDA may be an area on which an image is not displayed. However, the disclosure is not limited thereto, and the shape of the display area DD_DA and the shape of the non-display area DD_NDA may be designed to be relative to each other.

In an embodiment, the display device DD may include a sensing area and a non-sensing area. The display device DD may not only display an image through the sensing area but may also sense a touch input made on a display surface (or an input surface) or sense light that is incident thereon from the front. The non-sensing area may enclose the sensing area, but this is only for illustrative purposes, and the disclosure is not limited thereto. In an embodiment, a portion of the display area DD_DA may correspond to the sensing area.

The display panel DP may display an image. A self-emissive display panel such as an organic light emitting display panel (OLED panel) using an organic light emitting diode as a light emitting element, a subminiature light emitting diode (micro-LED or nano-LED) display panel using a subminiature LED as a light emitting element, and a quantum dot organic light emitting display panel (QD OLED panel) using a quantum dot and an organic light emitting diode, may be used as the display panel DP. In addition, a non-emissive display panel such as a liquid crystal display (LCD) panel, an electro-phoretic display (EPD) panel, or an electro-wetting display (EWD) panel may be used as the display panel DP. In case that the non-emissive display panel is used as the display panel DP, the display device DD may include a backlight part configured to supply light to the display panel DP.

The display panel DP may include a substrate SUB, and pixels PXL provided in the substrate SUB.

The substrate SUB may be formed of an area having an approximately rectangular shape. However, the number of areas provided in the substrate SUB may be changed. The shape of the substrate SUB may be changed depending on areas provided in the substrate SUB.

The substrate SUB may be made of insulating material such as glass or resin. Furthermore, the substrate SUB may be made of material having flexibility so as to be bendable or foldable, and have a single- or multi-layer structure. For instance, examples of the material having flexibility may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material forming (or constituting) the substrate SUB is not limited to that of the foregoing embodiments.

The substrate SUB may include a display area DA and a non-display area NDA. The display area DA may be an area in which the pixels PXL are provided and an image is thus displayed. The non-display area NDA may be an area in which the pixels PXL are not provided and may be an area in which an image is not displayed.

The display area DA of the substrate SUB (of the display panel DP) may correspond to the display area DD_DA of the display device DD. The non-display area NDA of the substrate SUB (or the display panel DP) may correspond to the non-display area DD_NDA of the display device DD. The non-display area NDA may correspond to a bezel area of the display device DD.

The non-display area NDA may be provided at at least one side of the display area DA. The non-display area NDA may enclose the perimeter (or edges) of the display area DA. A line component electrically connected to the pixels PXL, and a driver electrically connected to the line component and configured to drive the pixels PXL may be provided in the non-display area NDA.

The line component may electrically connect the driver with the pixels PXL. The line component may be a fan-out line electrically connected with signal lines, e.g., a scan line and a data line, which are electrically connected to each pixel PXL to provide signals to the pixel PXL.

The pixels PXL may be disposed in the display area DA of the substrate SUB. Each of the pixels PXL refers to a smallest unit for displaying an image. The pixels PXL each may include a light emitting element which emits white light and/or color light. Each of the pixels PXL may emit light of a color of red, green and blue, but the disclosure is not limited thereto, and the pixel PXL may emit light of a color such as cyan, magenta, or yellow.

The pixels PXL may be arranged in a matrix form in rows extending in the first direction DR1 and columns extending in the second direction DR2 intersecting the first direction DR1. However, the arrangement of the pixels PXL is not limited to a particular arrangement. In other words, the pixels PXL may be arranged in various forms. Although FIG. 3 illustrates that each of the pixels PXL has a rectangular shape, the disclosure is not limited thereto. The pixel PXL may have various shapes. Furthermore, in case that pixels PXL are provided, the pixels PXL may have different surface areas (or different sizes). For example, in case that pixels PXL emit different colors of light, the pixels PXL may have different surface areas (or different sizes) or different shapes by colors.

The driver may provide a signal and a power voltage to each pixel PXL through the line component to control the operation of the pixel PXL.

The display panel DP may include a pixel circuit layer PCL, a display element layer DPL, and an encapsulation layer ENL which are successively disposed on the substrate SUB.

The pixel circuit layer PCL may be provided on the substrate SUB, and include transistors and signal lines electrically connected to the transistors. For example, each transistor has a structure in which a semiconductor layer, a gate electrode, a first terminal, and a second terminal are sequentially stacked (e.g., in the order listed) with insulating layers interposed (or disposed) therebetween. The semiconductor layer may include amorphous silicon, polysilicon, low-temperature polysilicon, an organic semiconductor, and/or an oxide semiconductor. Although the gate electrode, the first terminal, and the second terminal each may include one of aluminum (Al), copper (Cu), titanium (Ti), and molybdenum (Mo), the disclosure is not limited thereto. In addition, the pixel circuit layer PCL may include at least one insulating layer.

The display element layer DPL may be disposed on the pixel circuit layer PCL. The display element layer DPL may include a light emitting element configured to emit light. Although the light emitting element may be, e.g., an organic light emitting diode, the disclosure is not limited thereto. In an embodiment, the light emitting element may be an inorganic light emitting element including inorganic light emitting material, or a light emitting element which changes the wavelength of light to be emitted using quantum dots and emits the light.

The encapsulation layer ENL may be selectively disposed on the display element layer DPL. The encapsulation layer ENL may be an encapsulation substrate or have the form of an encapsulation film having a multi-layer structure. In case that the encapsulation layer ENL has the form of the encapsulation film, the encapsulation layer ENL may include an inorganic layer and/or an organic layer. For example, the encapsulation layer ENL may have a structure formed by successively stacking an inorganic layer, an organic layer, and an inorganic layer. The encapsulation layer ENL may prevent external air or water from permeating the display element layer DPL or the pixel circuit layer PCL.

In an embodiment, the encapsulation layer ENL may be formed of thermosetting and/or photocurable resin, be applied in liquid form to the substrate SUB, and be hardened by a curing process using heat and/or light. Here, the encapsulation layer ENL may protect the light emitting element and, simultaneously, more stably fix the light emitting element.

The window WD may be disposed on the display panel DP to protect an exposed surface of the display panel DP. The window WD may protect the display panel DP from external impact, and provide an input surface and/or a display surface to a user. The window WD may be joined with (or bonded to) the display panel DP by an optical transparent adhesive (or bonding) agent OCA.

The window WD may have a multilayer structure including at least one selected from among a glass substrate, a plastic film, and a plastic substrate. The multilayer structure may be formed by a successive process or an adhesion process using an adhesive layer. The window WD may entirely or partially have flexibility.

A touch sensor (not illustrated) may be disposed between the display panel DP and the window WD. The touch sensor may be directly disposed on a surface of the display panel DP, from which an image is displayed, and be configured to receive a touch input of the user.

Figure 5:
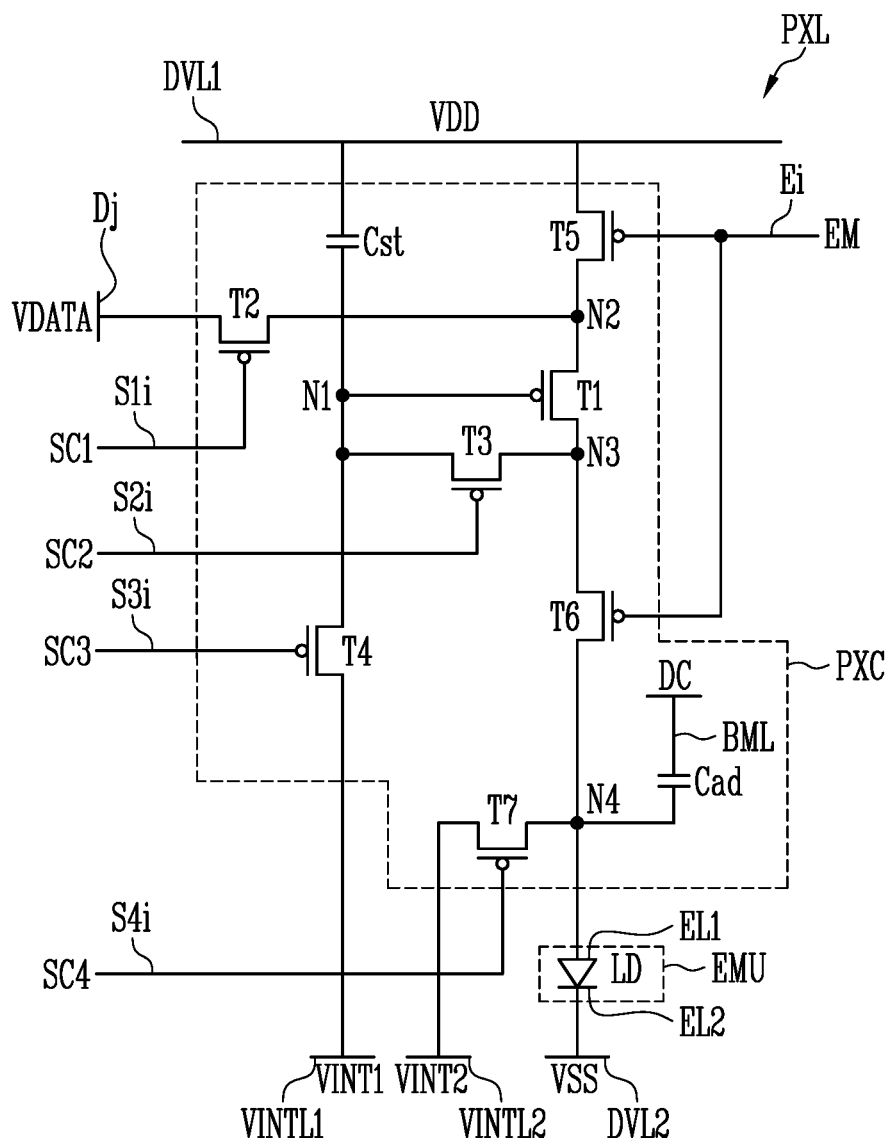
FIG. 5 is a schematic diagram of an equivalent circuit illustrating an embodiment of an electrical connection relationship of components included in each pixel illustrated in FIG. 3.

FIG. 5 is a schematic diagram of an equivalent circuit illustrating an embodiment of an electrical connection relationship of components included in each pixel PXL illustrated in FIG. 3.

For the sake of explanation, FIG. 5 illustrates a pixel PXL located on an i-th pixel row (or an i-th horizontal line) and electrically connected to an j-th data line Dj (where i and j each is a natural number greater than 0).

Referring to FIGS. 1 to 5, the pixel PXL may include an emission part EMU (or an emission part) configured to generate light having a luminance corresponding to a data signal. Furthermore, the pixel PXL may selectively further include a pixel circuit PXC configured to drive the emission part EMU.

The emission part EMU may include at least one light emitting element LD electrically connected in parallel between a first driving voltage line DVL1 to which a voltage of a first driving power supply VDD is to be applied, and a second driving voltage line DVL2 to which a voltage of a second driving power supply VSS is to be applied. For example, the emission part EMU may include a first electrode EL1 electrically connected to the first driving power supply VDD via the pixel circuit PXC and the first driving voltage line DVL1, a second electrode EL2 electrically connected to the second driving power supply VSS through the second driving voltage line DVL2, and a light emitting element LD electrically connected between the first electrode EL1 and the second electrode EL2. In an embodiment, the first electrode EL1 may be an anode, and the second electrode EL2 may be a cathode. The first driving power supply VDD and the second driving power supply VSS may have different potentials. A difference in potential between the first and second driving power supplies VDD and VSS may be set to a value equal to or greater than a threshold voltage of the light emitting element LD during an emission period of the pixel PXL.

The light emitting element LD included in the emission part EMU may include a first end electrically connected to the first electrode EL1, and a second end electrically connected to the second electrode EL2.

The first end of the light emitting element LD may be electrically connected to a fourth node N4, and the second end thereof may be electrically connected to the second driving power supply VSS. The light emitting element LD may emit light having a luminance corresponding to the amount of current (driving current) supplied from the first transistor T1. The light emitting element LD may be a light emitting diode having about a micrometer size. The light emitting element LD will be described below with reference to FIGS. 6A to 6C.

The pixel circuit PXC may include first to seventh transistors T1 to T7, a storage capacitor Cst, and an additional capacitor Cad.

A gate electrode of the first transistor (driving transistor) T1 may be electrically connected to a first node N1. A first electrode of the first transistor T1 may be electrically connected to a second node N2. A second electrode of the first transistor T1 may be electrically connected to a third node N3.

The first transistor T1 may control, in response to the voltage of the first node N1, the amount of current flowing from the first driving power supply VDD to the second driving power supply VSS via the light emitting element LD. To this end, the first driving power supply VDD may be set to a voltage higher than the second driving power supply VSS.

The second transistor (or switching transistor) T2 may be electrically connected between the second node N2 and the j-th data line Dj (hereinafter referred to as "data line") electrically connected to the pixel PXL. A gate electrode of the second transistor T2 may be electrically connected to a first scan line S1i electrically connected to the pixel PXL. In case that a first scan signal SC1 is supplied to the first scan line S1i, the second transistor T2 may be turned on to electrically connect the data line Dj to the second node N2.

The third transistor (or compensation transistor) T3 may be electrically connected between the second electrode (for example, the third node N3) and the gate electrode (for example, the first node N1) of the first transistor T1. A gate electrode of the third transistor T3 may be electrically connected to a second scan line S2i. In case that a second scan signal SC2 is supplied to the second scan line S2i, the third transistor T3 may be turned on so that the second electrode and the gate electrode of the first transistor T1 (or the first node N1 and the third node N3) may be electrically connected to each other. In other words, the timing at which the second electrode of the first transistor T1 and the gate electrode of the first transistor T1 are electrically connected to each other may controlled by the second scan signal SC2. If the third transistor T3 is turned on, the first transistor T1 may be electrically connected in the form of a diode.

The fourth transistor (or first initialization transistor) T4 may be electrically connected between the first node N1 (or the gate electrode of the first transistor T1) and a first initialization voltage line VINTL1. A gate electrode of the fourth transistor T4 may be electrically connected to a third scan line S3i. The fourth transistor T4 may be turned on in response to a third scan signal SC3 supplied to the third scan line S3i so that a first initialization voltage VINT1 may be supplied to the first node N1. The first initialization voltage VINT1 may be set to a voltage lower than a data voltage VDATA to be supplied to the data line Dj. Hence, a gate voltage of the first transistor T1 (or a voltage of the first node N1) may be initialized to the first initialization voltage VINT1 by turning on the fourth transistor T4.

The fifth transistor (or second emission control transistor) T5 may be electrically connected between the first driving voltage line DVL1 and the second node N2. A gate electrode of the fifth transistor T5 may be electrically connected to an i-th emission control line Ei (hereinafter referred to as an emission control line). The fifth transistor T5 may be turned on in case that an emission control signal EM is supplied to the emission control line Ei, and may be turned off in the other cases.

The sixth transistor (or first emission control transistor) T6 may be electrically connected between the fourth node N4 and the second electrode of the first transistor T1 (for example, the third node N3). A gate electrode of the sixth transistor T6 may be electrically connected to the emission control line Ei. An operation of controlling the sixth transistor T6 may be substantially identical with that of the fifth transistor T5.

The fifth transistor T5 and the sixth transistor T6 may be turned on in response to an emission control signal EM supplied thereto through the emission control line Ei, and form a flow path for driving current between the first driving voltage line DVL1 and the fourth node N4 (or between the first driving voltage line DVL1 and the second driving voltage line DVL2).

Although FIG. 5 illustrates that the fifth transistor T5 and the sixth transistor T6 are electrically connected to a same emission control line Ei, this is only for illustrative purposes. For example, the fifth transistor T5 and the sixth transistor T6 may be respectively electrically connected to separate emission control lines to which different emission control signals are to be supplied.

The seventh transistor (or second initialization transistor) T7 may be electrically connected between the fourth node N4 and a second initialization voltage line VINTL2. A gate electrode of the seventh transistor T7 may be electrically connected to a fourth scan line S4$i$. In case that a fourth scan signal SC4 is supplied to the fourth scan line S4$i$, the seventh transistor T7 may be turned on so that a second initialization voltage VINT2 may be supplied to the fourth node N4. The first initialization voltage line VINTL1 and the second initialization voltage VINT2 may be an identical voltage line (or power line).

In an embodiment, the first scan signal SC1 and the second scan signal SC2 may be supplied simultaneously.

The third scan signal SC3 may be the same as the first scan signal SC1 at a previous time point or on a previous pixel row. For example, the third scan signal SC3 that is provided to the pixel circuit PXC of the i-th pixel row may be the same as the first scan signal SC1 that is provided to the pixel circuit PXC of an i−1-th pixel row.

The fourth scan signal SC4 may be the same as the third scan signal SC3 at a subsequent time point or on a subsequent pixel row. For example, the fourth scan signal SC4 that is provided to the pixel circuit PXC of the i-th pixel row may be the same as the third scan signal SC3 that is provided to the pixel circuit PXC of an i+1-th pixel row.

The storage capacitor Cst may be electrically connected between the first driving voltage line DVL1 and the first node N1. The storage capacitor Cst may store a voltage corresponding to a difference between a voltage of the first driving power supply VDD by the first driving voltage line DVL1 and a voltage obtained by subtracting the absolute value of a threshold voltage of the first transistor T1 from a data voltage applied to the first node N1.

The additional capacitor Cad may be electrically connected between the fourth node N4 and an auxiliary bottom line BML. The additional capacitor Cad may include a first electrode electrically connected to the auxiliary bottom line BML, and a second electrode electrically connected to the fourth node N4. The additional capacitor Cad may block leakage current from being drawn into the light emitting element LD, thereby preventing a malfunction and/or emission error of the light emitting element LD from occurring.

A voltage of a third driving power supply DC may be applied to the auxiliary bottom line BML. The third driving power supply DC, and the first driving power supply VDD or the second driving power supply VSS may have a same voltage level. In an embodiment, the third driving power supply DC and the first initialization voltage VINT1 (or the second initialization voltage VINT2) may have a same voltage level. In other words, the third driving power supply DC may apply a voltage (e.g., a constant or fixed voltage).

Although for the sake of explanation FIG. 5 illustrates that the first to seventh transistors T1 to T7 included in the pixel circuit PXC are formed of P-type transistors (e.g., P-channel metal oxide semiconductor (PMOS) transistors), the disclosure is not limited thereto. In an embodiment, at least one of the first to seventh transistors T1 to T7 may be formed of an N-type transistor (an N-channel metal oxide semiconductor (NMOS) transistor). In an embodiment, at least one of the first to seventh transistors T1 to T7 may be formed of an oxide transistor.

Hereinafter, a light emitting element LD in accordance with an embodiment will be described with reference to FIGS. 6A to 6C.

Figure 6A:
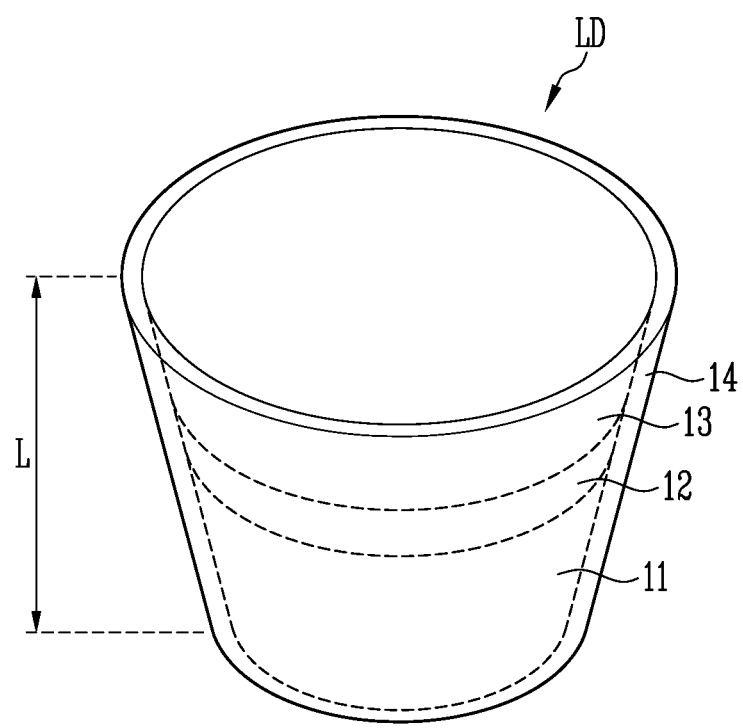
FIGS. 6A and 6B are perspective views schematically illustrating a light emitting element in accordance with an embodiment.
Figure 6B:
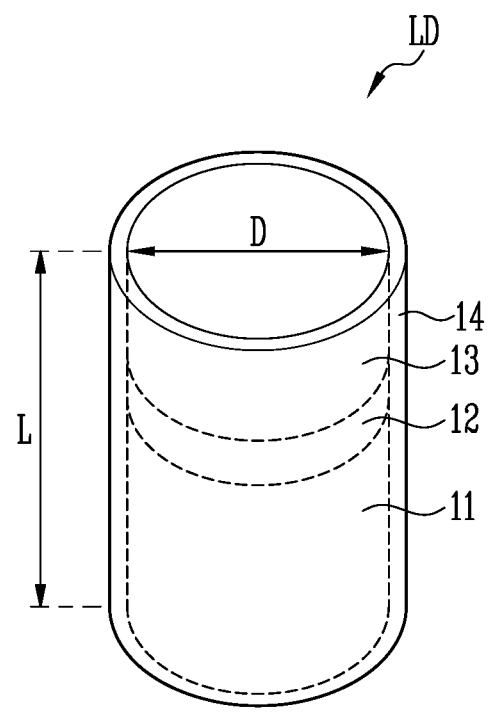

FIGS. 6A and 6B are perspective views schematically illustrating the light emitting element LD in accordance with an embodiment. FIG. 6C is a schematic cross-sectional view illustrating the light emitting element LD of FIG. 6B.

Referring to FIGS. 1 to 6C, the light emitting element LD may include a first semiconductor layer 11, a second semiconductor layer 13, and an active layer 12 interposed between the first semiconductor layer 11 and the second semiconductor layer 13.

The light emitting element LD may extend in a direction. If the direction in which the light emitting element LD extends is defined as a longitudinal direction, the light emitting element LD may have a first end EP1 and a second end EP2 in the longitudinal direction. One of the first semiconductor layer 11 and the second semiconductor layer 13 may be disposed at the first end EP1 of the light emitting element LD, and the other of the first semiconductor layer 11 and the second semiconductor layer 13 may be disposed at the second end EP2 of the light emitting element LD. For example, the second semiconductor layer 13 may be disposed at the first end EP1 of the light emitting element LD, and the first semiconductor layer 11 may be disposed at the second end EP2 of the light emitting element LD.

The light emitting element LD may have various shapes. For example, as illustrated in FIG. 6B, the light emitting element LD may have a rod-like shape, a bar-like shape, or a pillar-like shape which is long in the longitudinal direction (for example, to have an aspect ratio greater than 1). As another example, as illustrated in FIG. 6A, the light emitting element LD may have a rod-like shape, a bar-like shape, or a pillar-like shape in which the diameter of one end thereof is greater than the length thereof, and the diameter of the other end thereof is less than the length thereof. As another example, the light emitting element LD may have a rod-like shape, a bar-like shape, or a pillar-like shape having an aspect ratio of 1.

The light emitting element LD may be a light emitting diode (LED) having a diameter D and/or a length L to a degree of the micrometer scale. In an embodiment, the light emitting element LD may be a vertical light emitting diode which has a diameter D and/or length L to a degree of the micrometer scale and includes a first end EP1 and a second end EP2 which face each other. The size, shape, type, and/or the like of the light emitting element LD may be changed in various ways so as to meet requirements (or design conditions) of a lighting device or a self-emissive display device to which the light emitting element LD is to be applied.

The second semiconductor layer 13 may include, e.g., at least one p-type semiconductor layer. For example, the second semiconductor layer 13 may include a p-type semiconductor layer which includes at least one semiconductor material of InAlGaN, GaN, AlGaN, InGaN, AlN, and InN and is doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13. The second semiconductor layer 13 may include, in the longitudinal direction of the light emitting element LD, a first surface that contacts the active layer 12, and a second surface exposed to the outside. The second surface of the second semiconductor layer 13 may correspond to the first end EP1 (or the upper end) of the light emitting element LD.

The active layer 12 may be disposed under the second semiconductor layer 13 and have a single or multiple quantum well structure. For example, in case that the active layer 12 has a multiple quantum well structure, the active layer 12 may be formed by periodically repeatedly stacking a barrier layer (not shown), a stain reinforcing layer, and a well layer which are provided as a part. The stain reinforcing layer may have a lattice constant less than that of the barrier layer so that strain, e.g., compressive strain, to be applied to the well layer may be further reinforced. However, the structure of the active layer 12 is not limited to that of the foregoing embodiment.

The active layer 12 may emit light having a wavelength ranging from about 400 nm to about 900 nm, and use a double heterostructure. In an embodiment, a clad layer (not illustrated) doped with a conductive dopant may be formed over and/or under the active layer 12 in the longitudinal direction (L) of the light emitting element LD. For example, the cladding layer may be formed of an AlGaN layer or an InAlGaN layer. In an embodiment, material such as AlGaN or InAlGaN may be used to form the active layer 12, and various other materials may be used to form the active layer 12. The active layer 12 may include a first surface which contacts the second semiconductor layer 13, and a second surface which contacts the first semiconductor layer 11.

If the first end EP1 and the second end EP2 of the light emitting element LD are respectively supplied with corresponding signals (or voltages), the light emitting element LD may emit light by coupling or combination of electron-hole pairs in the active layer 12. Since light emission of the light emitting element LD may be controlled based on the foregoing principle, the light emitting element LD may be used as a light source (a light emitting source) of various light emitting devices as well as the pixel PXL of the display device DD.

The first semiconductor layer 11 may be disposed under the active layer 12 and include a semiconductor layer having a type different from that of the second semiconductor layer 13. For example, the first semiconductor layer 11 may include at least one n-type semiconductor layer. For instance, the first semiconductor layer 11 may include an n-type semiconductor layer which includes at least one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and various other materials may be used to form the first semiconductor layer 11. The first semiconductor layer 11 may include, in the longitudinal direction of the light emitting element LD, a first surface that contacts the active layer 12, and a second surface exposed to the outside. The second surface of the first semiconductor layer 11 may correspond to the second end EP2 (or the lower end) of the light emitting element LD.

Figure 6C:
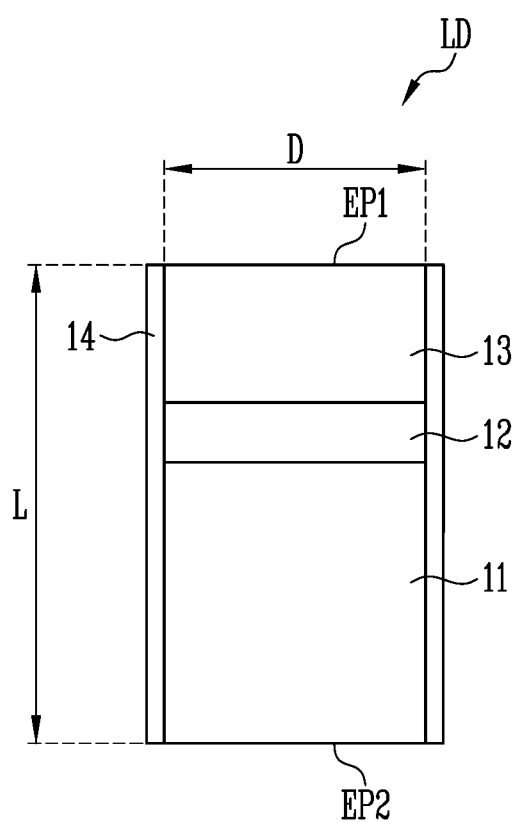
FIG. 6C is a schematic cross-sectional view illustrating the light emitting element of FIG. 6B.

Although FIGS. 6A to 6C illustrate each of the first semiconductor layer 11 and the second semiconductor layer 13 is formed of a single layer, the disclosure is not limited thereto. In an embodiment, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant therebetween. Although the TSBR layer may be formed of a p-type semiconductor layer such as p-GaInP, p-AlInP, or p-AlGaInP, the disclosure is not limited thereto.

In an embodiment, the light emitting element LD may further include a contact electrode (not illustrated, and hereinafter referred to as "first contact electrode") disposed under the first semiconductor layer 11, as well as including the first semiconductor layer 11, the active layer 12, and the second semiconductor layer 13. In an embodiment, the first contact electrode may be a bonding electrode which is bonded to the first electrode EL1 described with reference to FIG. 5.

In an embodiment, the light emitting element LD may further include another contact electrode (not illustrated, and hereinafter referred to as "second contact electrode") disposed over the second semiconductor layer 13.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chromium (Cr), titanium (Ti), aluminum (Al), gold (Au), nickel (Ni), and oxides or alloys thereof, which are used alone or in combination, but the disclosure is not limited thereto.

The light emitting element LD may further include an insulating layer 14. However, in an embodiment, the insulating layer 14 may be omitted, or provided to cover only a portion of the light emitting element LD.

The insulating layer 14 may prevent the active layer 12 from short-circuiting due to making contact with conductive material except the first and second semiconductor layers 11 and 13. Furthermore, the insulating layer 14 may minimize a surface defect of the light emitting element LD, thus enhancing the lifespan and emission efficiency of the light emitting element LD. It is not limited whether the insulating layer 14 is provided or not, so long as the active layer 12 may be prevented from short-circuiting with external conductive material.

The insulating layer 14 may be provided to enclose an overall outer circumferential surface of the light emitting element LD including the first semiconductor layer 11, the active layer 12, and the second semiconductor layer 13.

Although in the foregoing embodiment the insulating layer 14 has been described as enclosing the entirety of the respective outer circumferential surfaces of the first semiconductor layer 11, the active layer 12, and the second semiconductor layer 13, the disclosure is not limited thereto. In an embodiment, in case that the light emitting element LD includes the first contact electrode, the insulating layer 14 may enclose the entirety of the respective outer circumferential surfaces of the first semiconductor layer 11, the active layer 12, the second semiconductor layer 13, and the first contact electrode. In an embodiment, the insulating layer 14 may not enclose the entirety of the outer circumferential surface of the first contact electrode, or may enclose only a portion of the outer circumferential surface of the first contact electrode but not enclose the other portion of the outer circumferential surface of the first contact electrode. Furthermore, in an embodiment, in case that the first contact electrode is disposed on the second end EP2 (or the lower end) of the light emitting element LD and the second contact electrode is disposed on the first end EP1 (or the upper end) of the light emitting element LD, the insulating layer 14 may allow at least one area of each of the first and second contact electrodes to be exposed.

The insulating layer 14 may include a transparent insulating material. For example, the insulating layer 14 may be include one or more insulating materials selected from the group including silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating layer 14.

The insulating layer 14 may be provided in the form of a single layer or in the form of multiple layers including double layers. For example, in case that the insulating layer 14 is formed of a double layer structure including a first layer and a second layer that are successively stacked, the first layer and the second layer may be made of different materials (or substances) and be formed by different processes. In an embodiment, the first layer and the second layer may include a same material and be formed by a successive process.

Hereinafter, detailed configuration of the pixel PXL using the light emitting element LD as a light source will be described with reference to FIGS. 7 to 13.

Figure 7:
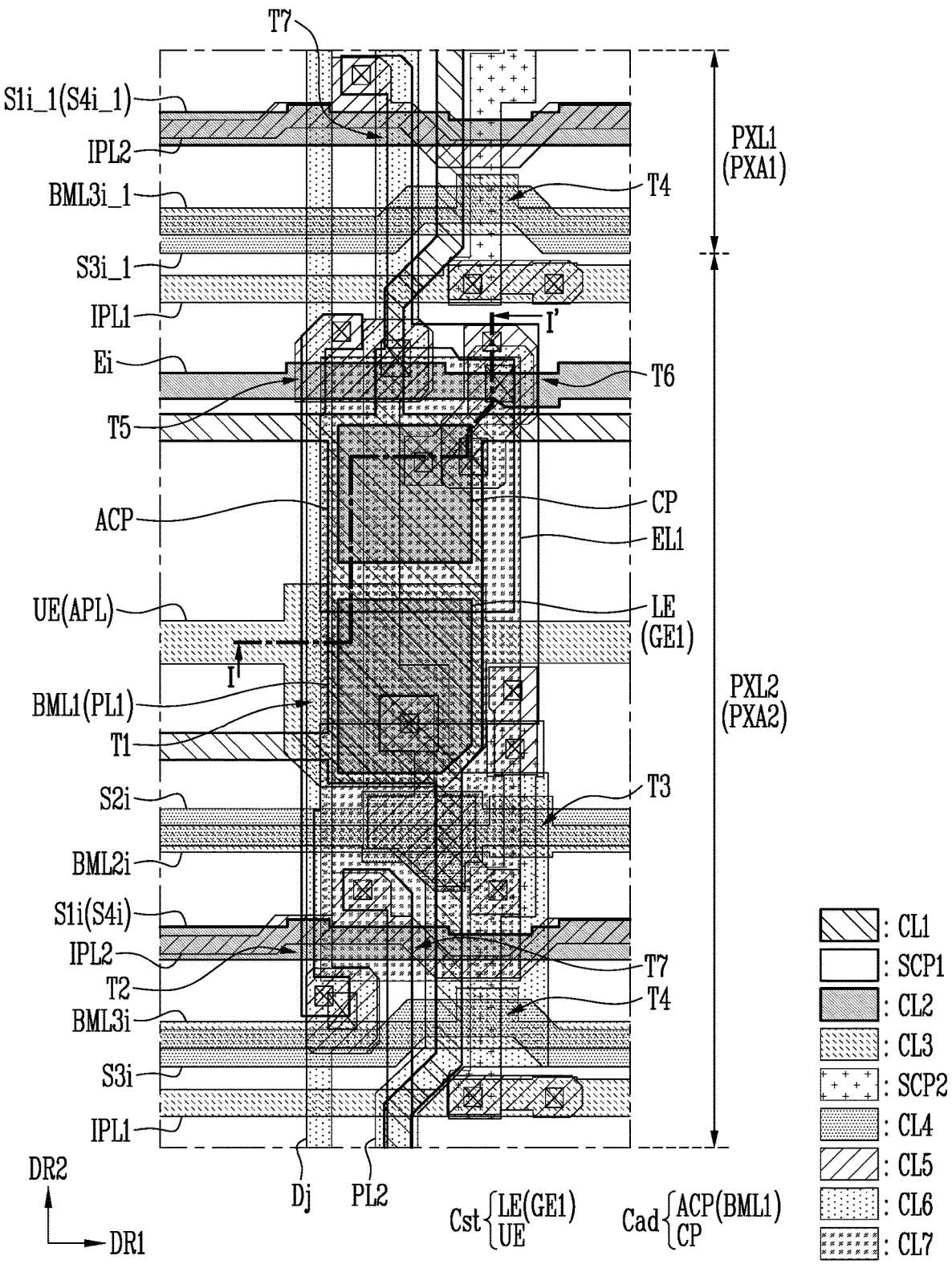
FIG. 7 is a plan view schematically illustrating a first pixel and a second pixel adjacent to the first pixel, in accordance with an embodiment of the disclosure.
Figure 8:
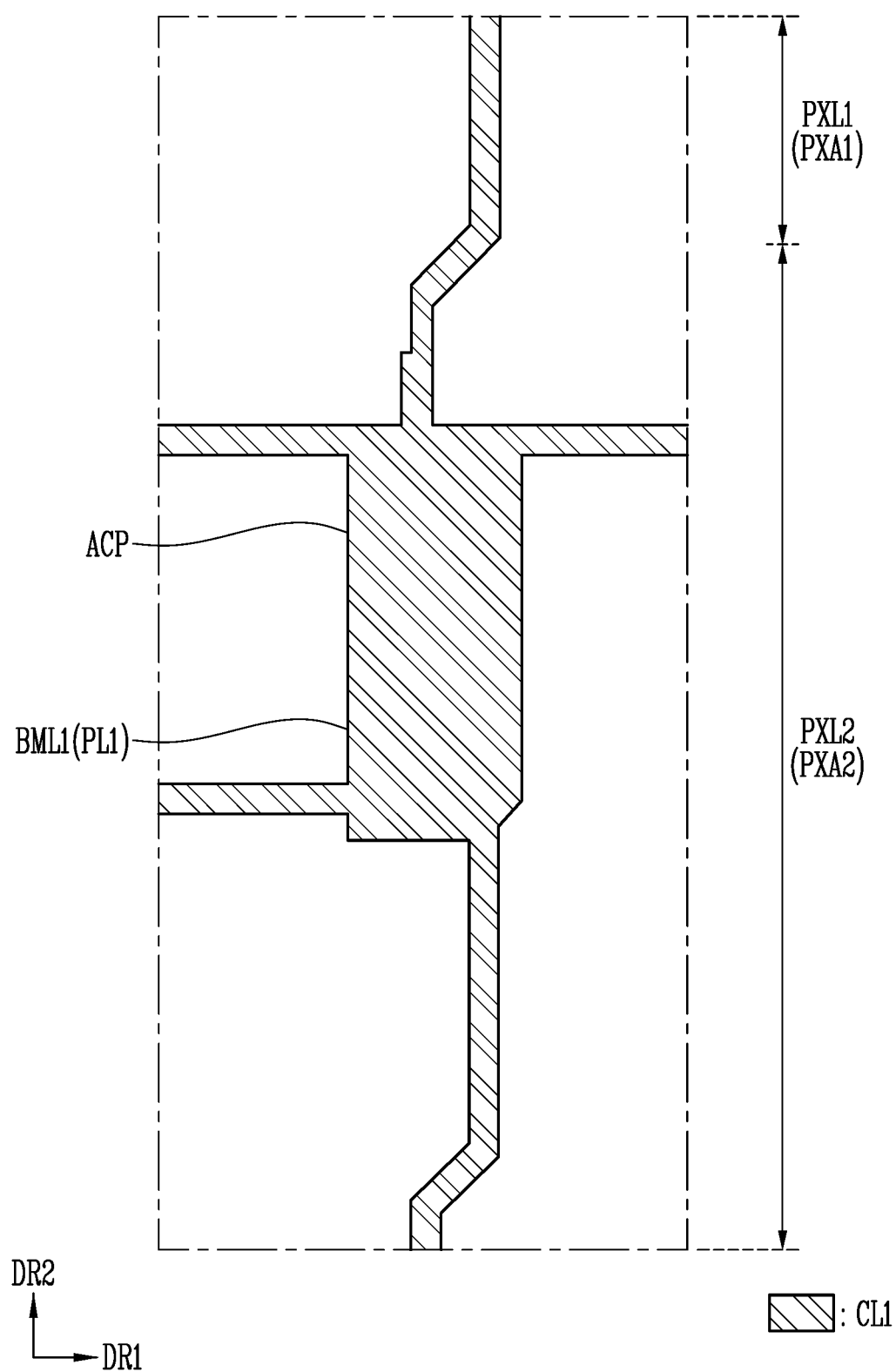
FIG. 8 is a schematic plan view illustrating an example of a first conductive layer of FIG. 7.
Figure 9:
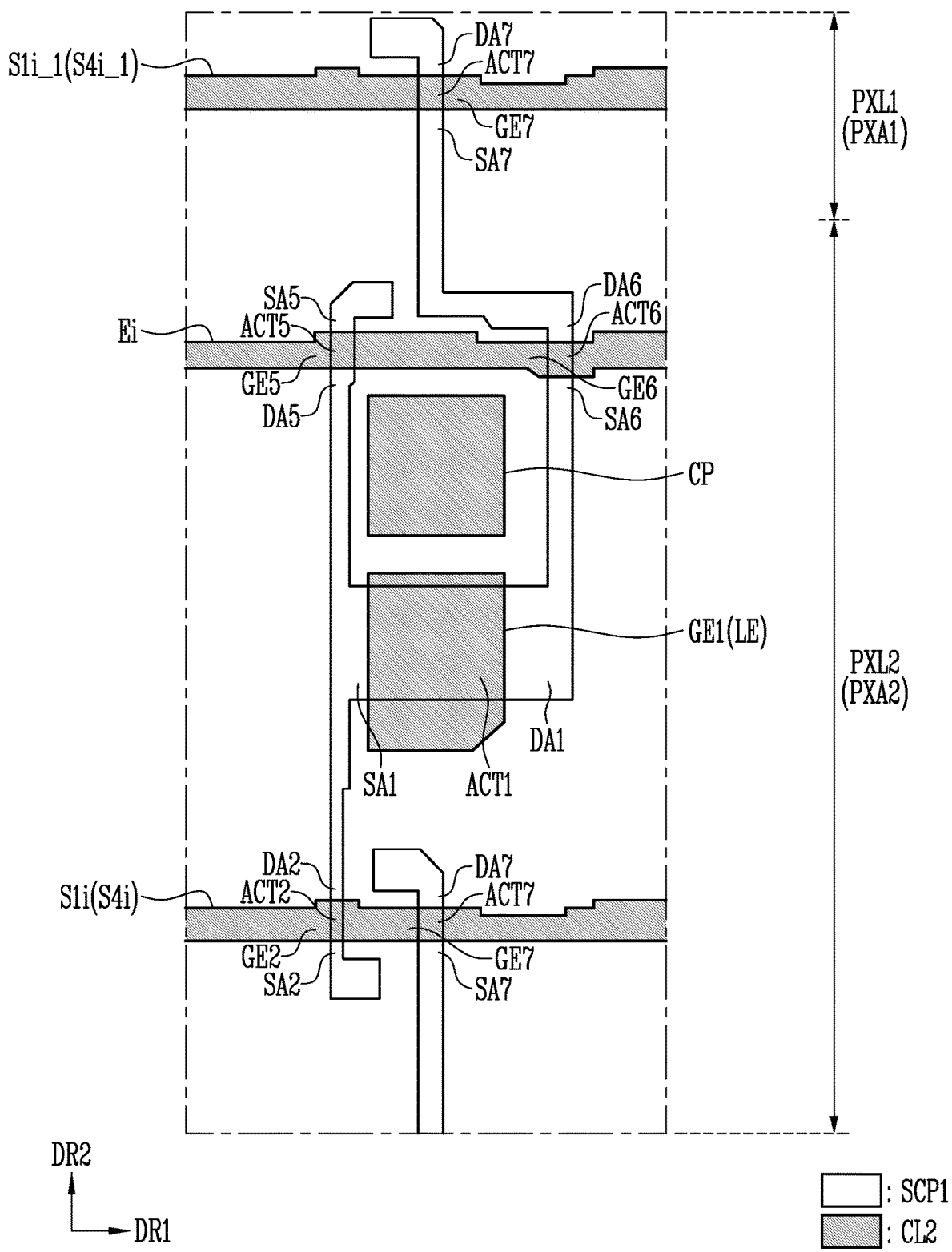
FIG. 9 is a schematic plan view illustrating examples of a first semiconductor pattern and a second conductive layer of FIG. 7.
Figure 10:
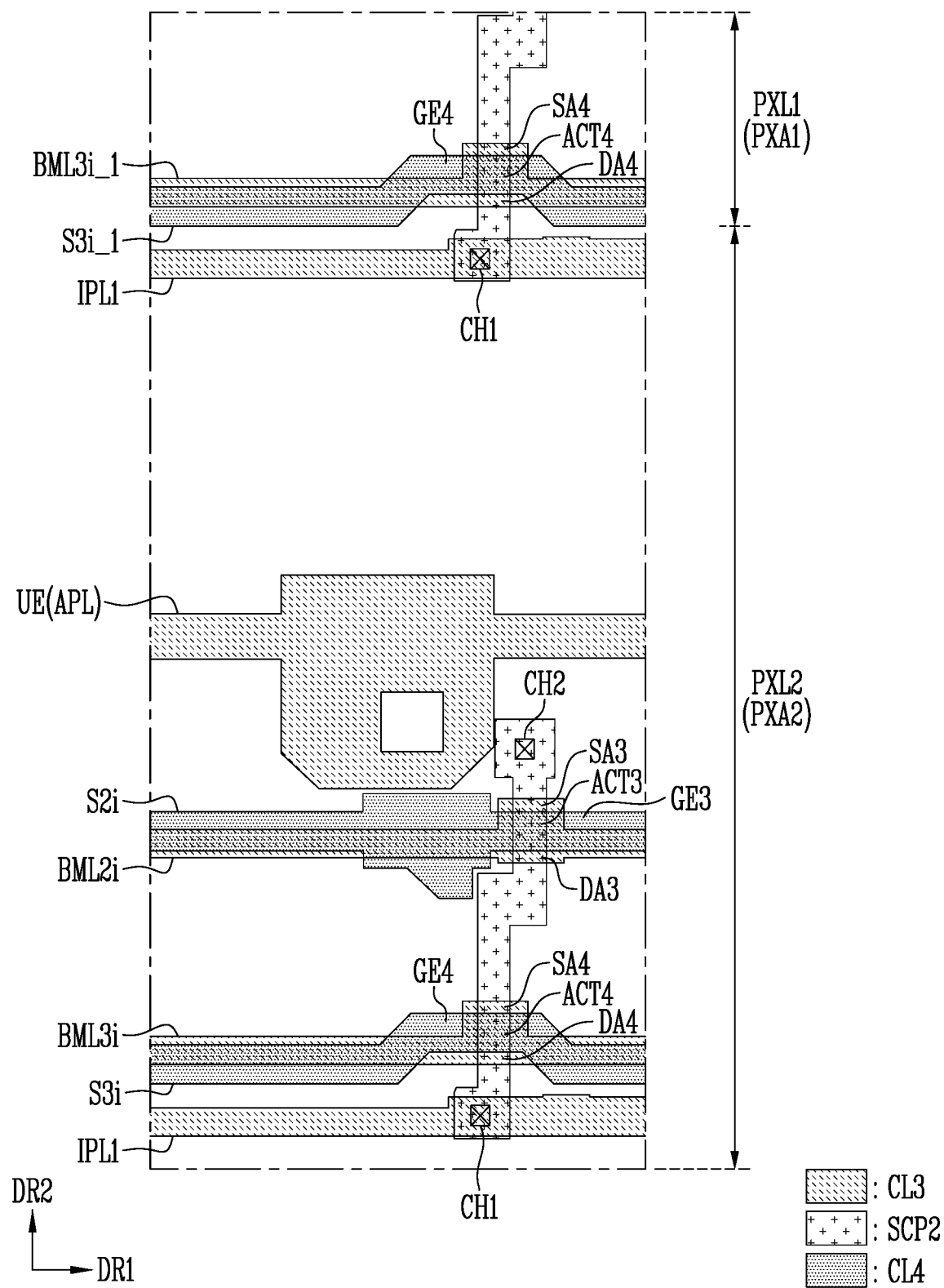
FIG. 10 is a schematic plan view illustrating examples of a third conductive layer, a second semiconductor pattern, and a fourth conductive layer of FIG. 7.
Figure 11:
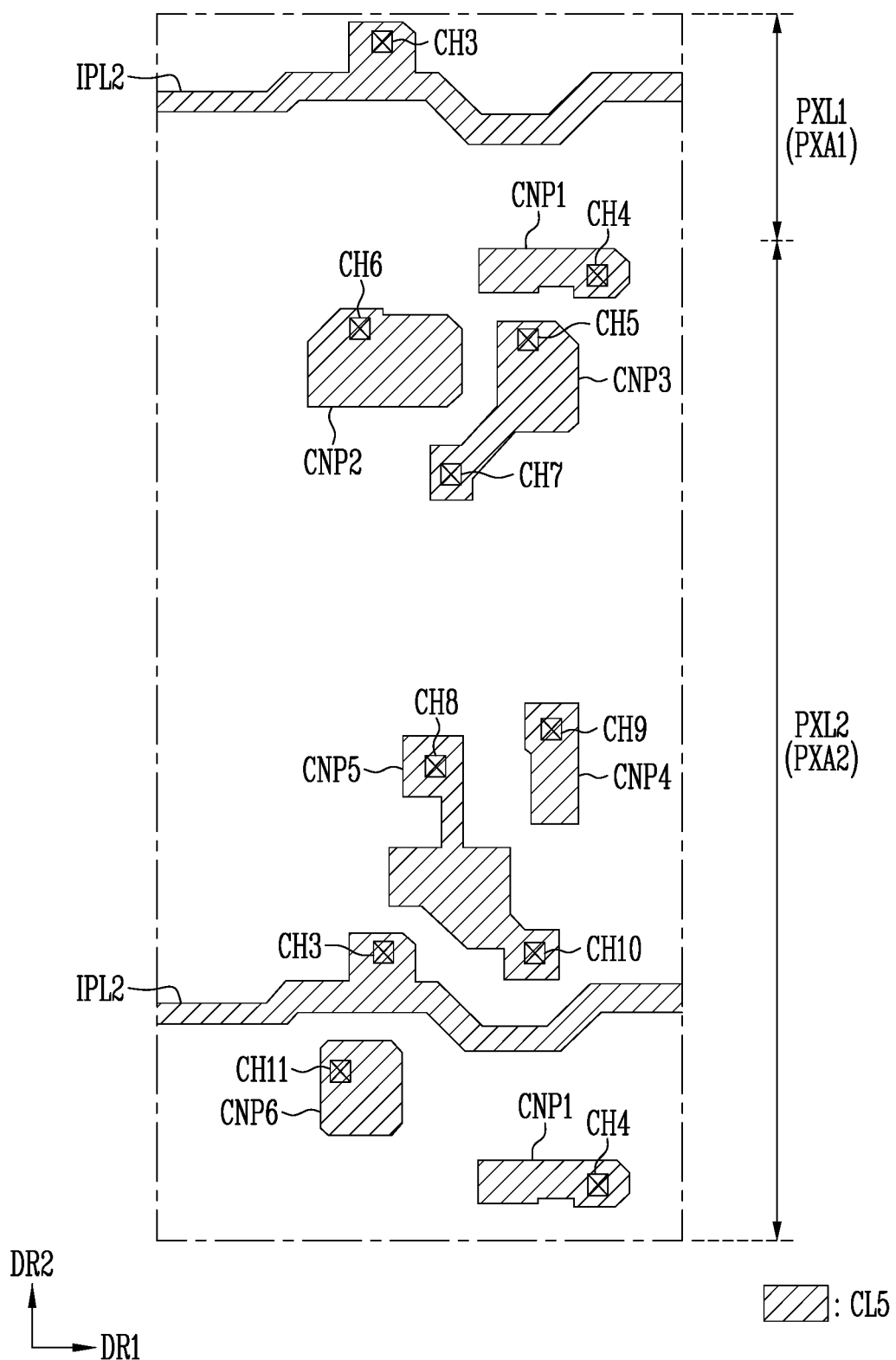
FIG. 11 is a schematic plan view illustrating an example of a fifth conductive layer of FIG. 7.
Figure 12:
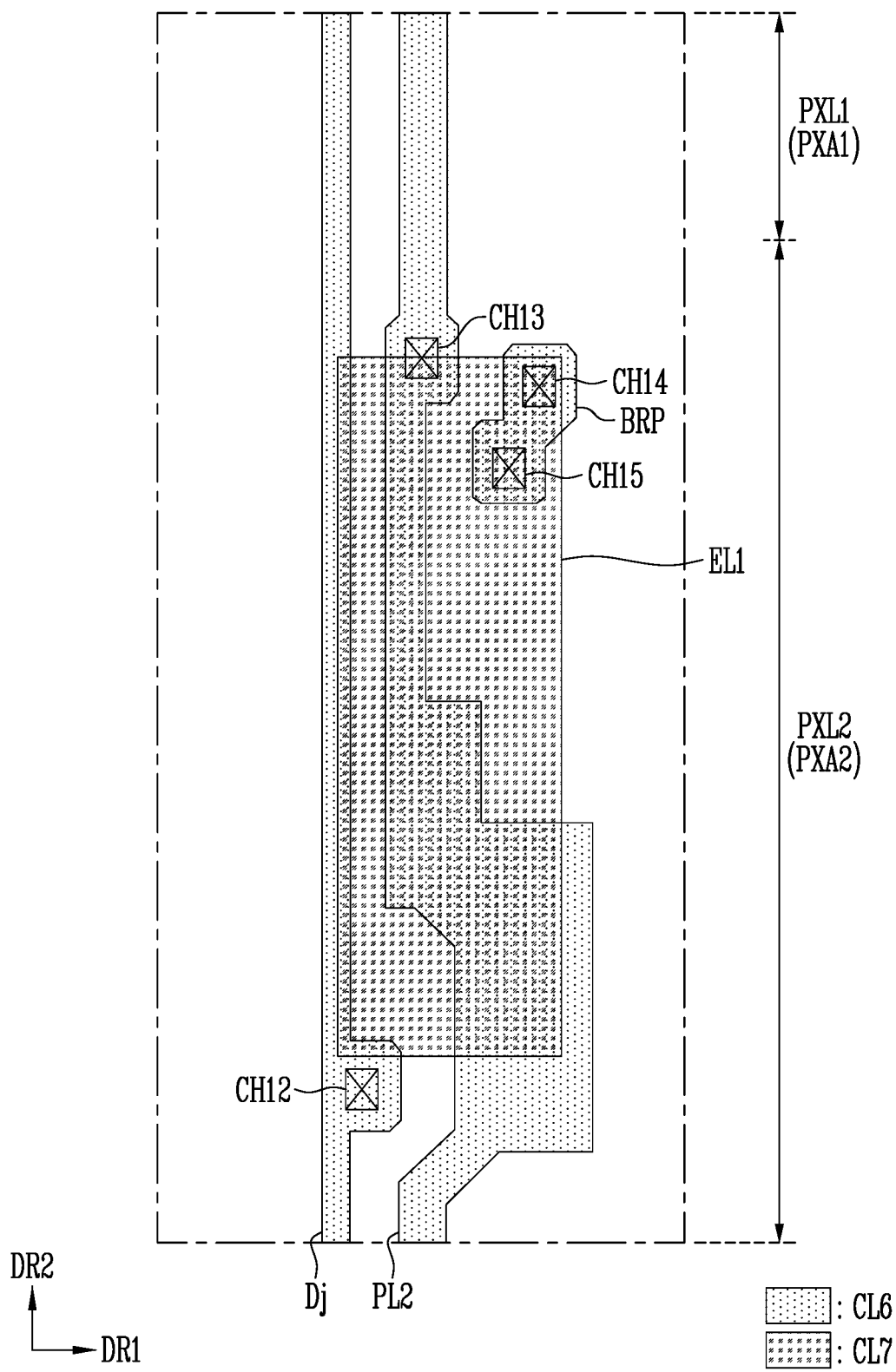
FIG. 12 is a schematic plan view illustrating examples of a sixth conductive layer and a seventh conductive layer of FIG. 7.
Figure 13:
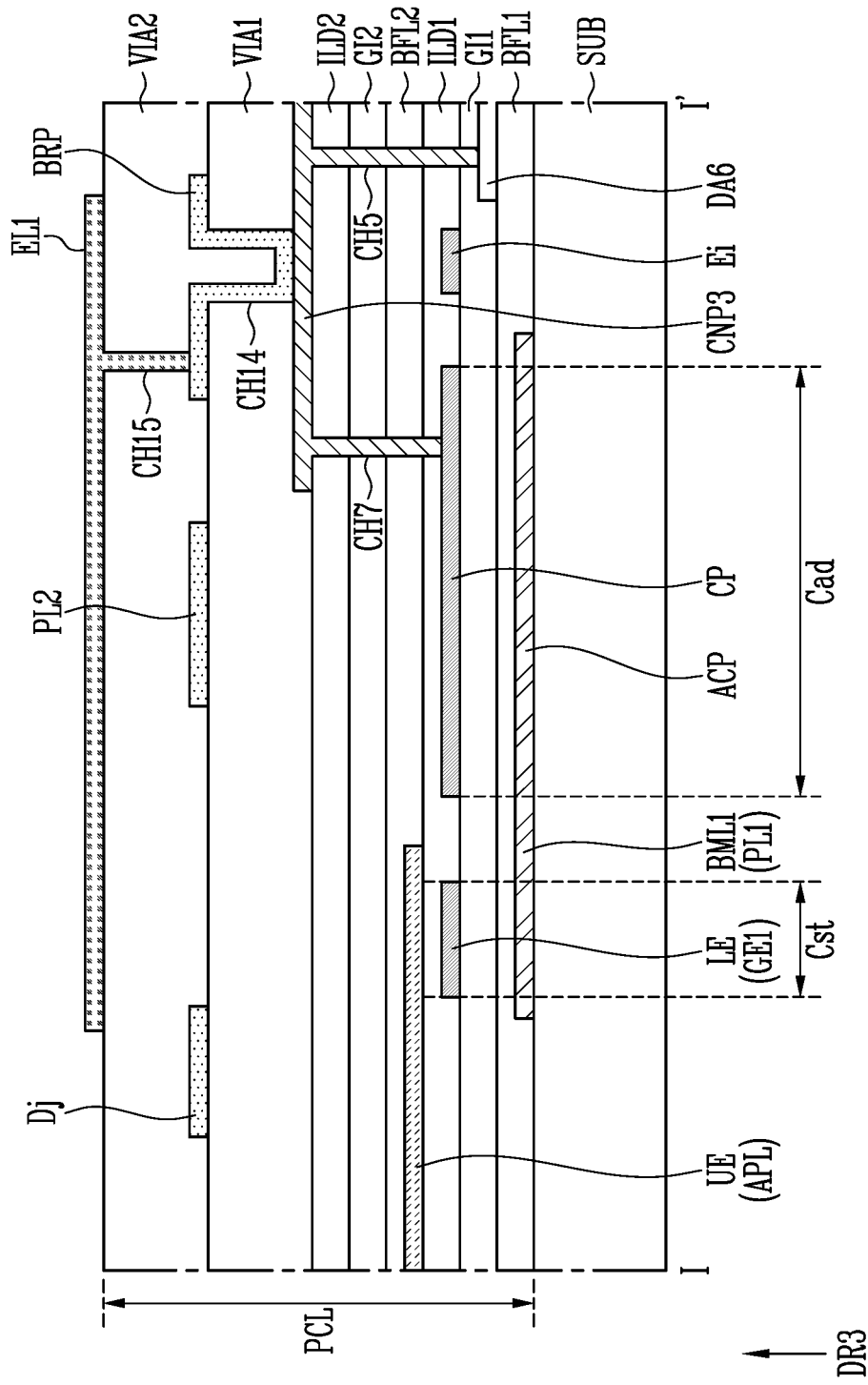
FIG. 13 is a schematic cross-sectional view taken along line I-I' of FIG. 7.

FIG. 7 is a plan view schematically illustrating a first pixel PXL1 and a second pixel PXL2 adjacent to the first pixel PXL1, in accordance with an embodiment of the disclosure. FIG. 8 is a schematic plan view illustrating an example of a first conductive layer CL1 of FIG. 7. FIG. 9 is a schematic plan view illustrating examples of a first semiconductor pattern SCP1 and a second conductive layer CL2 of FIG. 7. FIG. 10 is a schematic plan view illustrating examples of a third conductive layer CL3, a second semiconductor pattern SCP2, and a fourth conductive layer CL4 of FIG. 7. FIG. 11 is a schematic plan view illustrating an example of a fifth conductive layer CL5 of FIG. 7. FIG. 12 is a schematic plan view illustrating examples of a sixth conductive layer CL6 and a seventh conductive layer CL7 of FIG. 7. FIG. 13 is a schematic cross-sectional view taken along line I-I' of FIG. 7.

The light emitting element LD is omitted from FIGS. 7 to 13 for the sake of explanation.

FIGS. 7 to 13 illustrate signal lines electrically connected to the first pixel PXL1 and the second pixel PXL2, based on a first pixel PXL1 disposed on an i−1-th pixel row and a j-th pixel column disposed in the display area DA (see FIG. 3), and a second pixel PXL2 disposed on an i-th pixel row and the j-th pixel column.

As illustrated in FIGS. 7 to 12, for the sake of explanation, a transverse direction (or a horizontal direction) in a plan view is indicated by a first direction DR1, and a longitudinal direction (or a vertical direction) in a plan view is indicated by a second direction DR2. Furthermore, as illustrated in FIG. 13, a thickness-wise direction of the substrate SUB is indicated by a third direction DR3.

In an embodiment, the term "connection" between two components may embrace electrical connection and physical connection, but the disclosure is not limited thereto.

Although FIG. 13 schematically illustrates the second pixel PXL2, e.g., illustrating that each electrode is formed of a single electrode and each insulating layer is formed of a single insulating layer, the disclosure is not limited thereto.

In the description of embodiments, "components are provided and/or formed on a same layer" may mean that the components are formed by a same process, and "components are provided and/or formed on different layers" may mean that the components are formed by different processes. However, the disclosure is not limited thereto.

Referring to FIGS. 1 to 13, the first pixel PXL1 may be provided and/or formed in a first pixel area PXA1 provided in the substrate SUB. The second pixel PXL2 may be provided and/or formed in a second pixel area PXA2 provided in the substrate SUB.

Including a transparent insulating material, materials allowing light to pass therethrough may be used as the material of the substrate SUB. The substrate SUB may be a rigid substrate or a flexible substrate.

The rigid substrate may include, for example, a glass substrate, a quartz substrate, a glass ceramic substrate, and a crystalline glass substrate.

Examples of the flexible substrate may include a film substrate and a plastic substrate, each of which includes polymer organic material. For example, the flexible substrate may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP).

The first conductive layer CL1, the first semiconductor pattern SCP1, the second conductive layer CL2, the third conductive layer CL3, the second semiconductor pattern SCP2, the fourth conductive layer CL4, the fifth conductive layer CL5, the sixth conductive layer CL6, and the seventh conductive layer CL7 may be successively disposed on the substrate SUB with insulating layers interposed therebetween. The pixel circuit PXC of each of the first and second pixels PXL1 and PXL2 may be formed by the first semiconductor pattern SCP1, the second conductive layer CL2, the third conductive layer CL3, the second semiconductor pattern SCP2, the fourth conductive layer CL4, the fifth conductive layer CL5, the sixth conductive layer CL6, and the seventh conductive layer CL7.

As illustrated in FIG. 13, the insulating layers disposed on the substrate SUB may include a first buffer layer BFL1 (or first insulating layer), a first gate insulating layer GI1 (or second insulating layer), a first interlayer insulating layer (or third insulating layer) ILD1, a second buffer layer BFL2, a second gate insulating layer GI2, a second interlayer insulating layer ILD2, a first via layer VIA1, and a second via layer VIA2.

The first buffer layer BFL1 may be provided and/or formed on the overall surfaces of the first conductive layer CL1 and the substrate SUB. The first buffer layer BFL1 may prevent impurities from diffusing into the transistors T1 to T7 included in the pixel circuit PXC. The first buffer layer BFL1 may include an inorganic insulating layer including an inorganic material. The first buffer layer BFL1 may include at least one of silicon nitride ($SiN_x$), silicon oxide ($SiO_x$), silicon oxynitride ($SiO_xN_y$), and metal oxide such as aluminum oxide (AlO$_x$). Although the first buffer layer BFL1 may be provided in a single-layer structure, the first buffer layer BFL1 may be provided in a multi-layer structure having at least two or more layers. In case that the first buffer layer BFL1 has a multi-layer structure, the respective layers may be formed of a same material or different materials. The first buffer layer BFL1 may be omitted depending on the material of the substrate SUB or processing conditions.

The first gate insulating layer GI may be provided and/or formed on the overall surfaces of the first semiconductor pattern SCP1 and the first buffer layer BFL1. The first gate insulating layer GI1 may be an inorganic insulating layer including an inorganic material. For example, the first gate insulating layer GI1 may include at least one of silicon nitride (SiN$_x$), silicon oxide (SiO$_x$), silicon oxynitride (SiO$_x$N$_y$), and metal oxides such as aluminum oxide (AlO$_x$). However, the material of the first gate insulating layer GI1 is not limited to that of the foregoing embodiments. In an embodiment, the first gate insulating layer GI1 may be formed of an organic insulating layer including an organic material. Although the first gate insulating layer GI1 may be provided in a single-layer structure, the first gate insulating layer GI1 may be provided in a multi-layer structure having at least two or more layers.

The first interlayer insulating layer ILD1 may be provided and/or formed on the overall surfaces of the second conductive layer CL2 and the first gate insulating layer GI1. The first interlayer insulating layer ILD1 and the first gate insulating layer GI1 may include a same material, or the first interlayer insulating layer ILD1 may include one or more materials selected from among materials exemplified as the material for forming the first gate insulating layer GI1. For example, the first interlayer insulating layer ILD1 may be an inorganic insulating layer.

The second buffer layer BFL2 may be provided and/or formed on the overall surfaces of the third conductive layer CL3 and the first interlayer insulating layer ILD1. The second buffer layer BFL2 and the first buffer layer BFL1 may include a same material, or the second buffer layer BFL2 may include one or more materials selected from among materials exemplified as the constituent material of the second buffer layer BFL2.

The second gate insulating layer GI2 may be provided and/or formed on the overall surfaces of the second semiconductor pattern SCP2 and the second buffer layer BFL2. The second gate insulating layer GI2 and the first gate insulating layer GI1 may include a same material, or the second gate insulating layer GI2 may include one or more materials selected from among materials exemplified as the material for forming the first gate insulating layer GI1. For example, the second gate insulating layer GI2 may be an inorganic insulating layer.

The second interlayer insulating layer ILD2 may be provided and/or formed on the overall surfaces of the fourth conductive layer CL4 and the second gate insulating layer GI2. The second interlayer insulating layer ILD2 and the first gate insulating layer GI1 may include a same material, or the second interlayer insulating layer ILD2 may include one or more materials selected from among materials exemplified as the material for forming the first gate insulating layer GI1. For example, the second interlayer insulating layer ILD2 may be an inorganic insulating layer.

The first via layer VIA1 may be provided and/or formed on the overall surfaces of the fifth conductive layer CL5 and the second interlayer insulating layer ILD2. The first via layer VIA1 may be formed of a single layer including an organic insulating layer, or formed of multiple layers including two or more layers including an organic insulating layer. In an embodiment, the first via layer VIA1 may include an inorganic insulating layer and an organic insulating layer disposed on the inorganic insulating layer. In case that the first via layer VIA1 is formed of multiple layers, the organic insulating layer that forms the first via layer VIA1 may be disposed on the uppermost layer of the first via layer VIA1. The first via layer VIA1 may include at least one of polyacrylates resin, epoxy resin, phenolic resin, polyamides resin, polyimides rein, unsaturated polyesters resin, polyphenylene ethers resin, polyphenylene sulfides resin, and benzocyclobutene resin. In an embodiment, the first via layer VIA1 may be formed of an inorganic insulating layer.

The second via layer VIA2 may be provided and/or formed on the overall surfaces of the sixth conductive layer CL6 and the first via layer VIA1. The second via layer VIA2 and the first via layer VIA1 may include a same material, or the second via layer VIA2 may include one or more materials selected from among materials exemplified as the constituent material of the first via layer VIA1.

The seventh conductive layer CL7 may be provided and/or formed on the second via layer VIA2.

Each of the first pixel PXL1 and the second pixel PXL2 may include a pixel circuit PXC disposed on the substrate SUB, and various signal lines electrically connected to the pixel circuit PXC. The structure and/or configuration of the first pixel PXL1 and the second pixel PXL2 may be substantially equal or similar. Hereinafter, for the sake of explanation, the second pixel PXL2 will be representatively described, and descriptions of the first pixel PXL1 will be simplified.

The second pixel PXL2 may include a pixel circuit layer PCL on which the pixel circuit PXC and the signal lines electrically connected to the pixel circuit PXC are disposed. For the sake of explanation, the signal lines disposed on the pixel circuit layer PCL will be described before description of the pixel circuit PXC.

The signal lines may include scan lines S1$i$, S2$i$, S3$i$, and S4$i$, an emission control line Ei, a data line Dj, a first auxiliary bottom line BML1, a second power line PL2, a first initialization power line IPL1, and a second initialization power line IPL2.

The scan lines S1$i$, S2$i$, S3$i$, and S4$i$ may extend in the first direction DR1. The scan lines S1$i$, S2$i$, S3$i$, and S4$i$ may include a first scan line S1$i$, a second scan line S2$i$, a third scan line S3$i$, and a fourth scan line S4$i$. The first scan line S1$i$ may correspond to the first scan line S1$i$ described with reference to FIG. 5. The second scan line S2$i$ may correspond to the second scan line S2$i$ described with reference to FIG. 5. The third scan line S3$i$ may correspond to the third scan line S3$i$ described with reference to FIG. 5. The fourth scan line S4$i$ may correspond to the fourth scan line S4$i$ described with reference to FIG. 5. The first scan line S1$i$ and the fourth scan line S4$i$ may be integral with each other. In this case, the first scan line S1$i$ may be the fourth scan line S4$i$, or the fourth scan line S4$i$ may be the first scan line S1$i$.

The first scan line S1$i$ (or the fourth scan line S4$i$), the second scan line S2$i$, and the third scan line S3$i$ may be respectively supplied with corresponding scan signals. For example, a first scan signal may be applied to the first scan line S1$i$ (or the fourth scan line S4$i$). A second scan signal may be applied to the second scan line S2$i$. A third scan signal may be applied to the third scan line S3$i$.

The first scan line S1$i$ may be formed of the second conductive layer CL2. The second and third scan lines S2$i$ and S3$i$ may be formed of the fourth conductive layer CL4. The second conductive layer CL2 may be provided and/or formed on the first gate insulating layer GI1. The fourth conductive layer CL4 may be provided and/or formed on the second gate insulating layer GI2.

The emission control line Ei may extend in the first direction DR1 and be supplied with an emission control signal. The emission control line Ei may correspond to the emission control line Ei described with reference to FIG. 5. The emission control line Ei may be formed of the second conductive layer CL2. The emission control line Ei and the first scan line S1i may include a same material, and be formed by a same process.

As illustrated in FIGS. 7 and 12, the data line Dj may extend in the second direction DR2. The data line Dj may correspond to the data line Dj described with reference to FIG. 5. The data line Dj may be formed of the sixth conductive layer CL6. The sixth conductive layer CL6 may be provided and/or formed on the first via layer VIA1.

The first auxiliary bottom line BML1 may be a first power line PL1 to which a voltage of the first driving power supply VDD is to be applied, and may include, as illustrated in FIG. 8, a body, a first extension which diverges from the body in the first direction DR1, and a second extension which diverges from the body in the second direction DR2. The first auxiliary bottom line BML1 may correspond to the auxiliary bottom line BML described with reference to FIG. 5. The first auxiliary bottom line BML1 may be formed of the first conductive layer CL1. The first auxiliary bottom line BML1 may be disposed between the substrate SUB and the first buffer layer BFL1. The first auxiliary bottom line BML1 may overlap a channel area of the first transistor T1. In an embodiment, the first auxiliary bottom line BML1 may be provided in common in the second pixel PXL2 and in pixels PXL adjacent to the second pixel PXL2 in the first direction DR1, thus forming a mesh shape in the display area DA.

The first auxiliary bottom line BML1 may be used as a light block component which blocks light drawn through a rear surface of the substrate SUB and protects the channel area of the first transistor T1. To this end, the first auxiliary bottom line BML1 may be formed of conductive material (or substance) having a reflectivity.

As illustrated in FIGS. 7 and 12, the second power line PL2 may extend in the second direction DR2. The second power line PL2 may correspond to the first driving voltage line DVL1 described with reference to FIG. 5. A voltage of the first driving power supply VDD may be applied to the second power line PL2. The second power line PL2 may be provided in common in the second pixel PXL2 and in the pixels PXL (e.g., first pixels PXL1) adjacent to the second pixel PXL2 in the second direction DR2. The second power line PL2 may be electrically connected to the first auxiliary bottom line BML1 in the non-display area NDA of the substrate SUB. Hence, an identical signal, for example, a voltage of the first driving power supply VDD, may be applied to the second power line PL2 and the first auxiliary bottom line BML1. The second power line PL2 may be formed of the sixth conductive layer CL6. The second power line PL2 and the data line Dj may include a same material, and be formed by a same process.

As illustrated in FIGS. 7 and 10, the first initialization power line IPL1 may extend in the first direction DR1 and be disposed at a position spaced apart from the third scan line S3i. The first initialization power line IPL1 may correspond to the first initialization voltage line VINTL1 described with reference to FIG. 5. The first initialization power line IPL1 may be formed of the third conductive layer CL3 and provided and/or formed on the first interlayer insulating layer ILD1. The first initialization power line IPL1 provided in the first pixel PXL1 may be disposed at a position spaced apart from an i−1-th third scan line S3i_1. The i−1-th third scan line S3i_1 of the first pixel PXL1 may be a component corresponding to the third scan line S3i of the second pixel PXL2, and may be formed of the third conductive layer CL3 and provided and/or formed on the first interlayer insulating layer ILD1.

As illustrated in FIGS. 7 and 11, the second initialization power line IPL2 may extend in the first direction DR1 and be disposed to partially overlap the first scan line S1i. The second initialization power line IPL2 may correspond to the second initialization voltage line VINTL2 described with reference to FIG. 5. The second initialization power line IPL2 may be formed of the fifth conductive layer CL5 and provided and/or formed on the second interlayer insulating layer ILD2. The second initialization power line IPL2 provided in the first pixel PXL1 may be disposed to partially overlap an i−1-th first scan line S1i_1 (or a i−1-th fourth scan line S4i_1). The i−1-th first scan line S1i_1 of the first pixel PXL1 may be a component corresponding to the first scan line S1i of the second pixel PXL2, and may be formed of the second conductive layer CL2.

The second pixel PXL2 may further include a second auxiliary bottom line BML2i which partially overlaps the second scan line S2i, and a third auxiliary bottom line BML3i which partially overlaps the third scan line S3i. The second auxiliary bottom line BML2i may be electrically connected to the second scan line S2i in the non-display area NDA of the substrate SUB. The third auxiliary bottom line BML3i may be electrically connected to the third scan line S3i in the non-display area NDA of the substrate SUB. The second and third auxiliary bottom lines BML2i and BML3i may be formed of the third conductive layer CL3 and provided and/or formed on the first interlayer insulating layer ILD1. The second and third auxiliary bottom lines BML2i and BML3i and the first initialization power line IPL1 may include a same material and be formed by a same process.

In an embodiment, the second auxiliary bottom line BML2i may be disposed under the third transistor T3 and overlap a channel area of the third transistor T3. The third auxiliary bottom line BML3i may be disposed under the fourth transistor T4 and overlap a channel area of the fourth transistor T4. The second and third auxiliary bottom lines BML2i and BML3i may be used as light block components which block light drawn through the rear surface of the substrate SUB and protect the respective channel areas of the third and fourth transistors T3 and T4. To this end, the second and third auxiliary bottom lines BML2i and BML3i each may be formed of conductive material (or substance) having a reflectivity.

An i−1-th third auxiliary bottom line BML3i_1 which partially overlaps the i−1-th third scan line S3i_1 may be disposed in the first pixel PXL1. The i−1-th third auxiliary bottom line BML3i_1 may be a component corresponding to the third auxiliary bottom line BML3i of the second pixel PXL2, and be formed of the third conductive layer CL3.

The pixel circuit PXC of the second pixel PXL2 may include first to seventh transistors T1 to T7, a storage capacitor Cst, and an additional capacitor Cad.

The first transistor T1 may include a first gate electrode GE1, a first active pattern ACT1, a first source area SA1, and a first drain area DA1. The first transistor T1 may overlap the first auxiliary bottom line BML1 (or the first power line PL1).

The first gate electrode GE1 may overlap the body of the first auxiliary bottom line BML1. The first gate electrode GE1 may be formed of the second conductive layer CL2. The second conductive layer CL2 may have a single-layer structure formed of at least one selected from the group including copper (Cu), molybdenum (Mo), tungsten (W), aluminum neodymium (AlNd), titanium (Ti), aluminum (Al), silver (Ag), and an alloy thereof, or a mixture thereof, or may have a double-layer or multi-layer structure formed of molybdenum (Mo), titanium (Ti), copper (Cu), aluminum (Al), or silver (Ag) to reduce line resistance.

In an embodiment, the first gate electrode GE1 may be integral with a first electrode (or lower electrode) LE of the storage capacitor Cst. Furthermore, the first gate electrode GE1 may be integral with a second conductive layer CL2 to be described below.

The first gate electrode GE1 may be electrically connected to the third transistor T3 and the fourth transistor T4 through a fifth connection pattern CNP5.

The fifth connection pattern CNP5 may be electrically connected to the first gate electrode GE1 through an eighth contact hole CH8, and electrically connected to a third drain area DA3 and a fourth source area SA4 through a tenth contact hole CH10. The fifth connection pattern CNP5 may be formed of the fifth conductive layer CL5 and provided and/or formed on the second interlayer insulating layer ILD2.

The first active pattern ACT1, the first source area SA1, and the first drain area DA1 each may be formed of a first semiconductor pattern SCP1 made of polysilicon. Each of the first active pattern ACT1, the first source area SA1, and the first drain area DA1 may be formed of an undoped semiconductor layer or a semiconductor layer doped with an impurity. For example, each of the first source area SA1 and the first drain area DA1 may be formed of a semiconductor layer doped with an impurity. The first active pattern ACT1 may be formed of an undoped semiconductor layer. For example, a p-type impurity may be used as the impurity.

The first active pattern ACT1 may be a channel area of the first transistor T1 as an area overlapping the first gate electrode GE1. In case that the first active pattern ACT1 is relatively long, the channel area of the first transistor T1 may also be relatively long. In this case, a driving range of a gate voltage (or a gate signal) to be applied to the first transistor T1 may be increased.

One end (or first end) of the first active pattern ACT1 may be electrically connected to the first source area SA1, and the other end (or second end) thereof may be electrically connected to the first drain area DA1.

The first source area SA1 may be electrically connected to the first active pattern ACT1, a second drain area DA2 of the second transistor T2, and a fifth drain area DA5 of the fifth transistor T5. The second drain area DA2 and the fifth drain area DA5 may be formed of the first semiconductor pattern SCP1.

The first drain area DA1 may be electrically connected to the first active pattern ACT1 and a sixth source area SA6 of the sixth transistor T6. The sixth source area SA6 may be formed of the first semiconductor pattern SCP1. Furthermore, the first drain area DA1 may be electrically connected to the third transistor T3 through a fourth connection pattern CNP4.

The fourth connection pattern CNP4 may be electrically connected to the first drain area DA1 (or the sixth source area SA6) through a ninth contact hole CH9, and be electrically connected to the third source area SA3 through a second contact hole CH2. The fourth connection pattern CNP4 may be formed of the fifth conductive layer CL5 and provided and/or formed on the second interlayer insulating layer ILD2.

The second transistor T2 may include a second gate electrode GE2, a second active pattern ACT2, a second source area SA2, and a second drain area DA2. The second active pattern ACT2, the second source area SA2, and the second drain area DA2 may be formed of the first semiconductor pattern SCP1.

As illustrated in FIG. 9, the second gate electrode GE2 may be integral with the first scan line S1$i$. The second gate electrode GE2 may be formed of the second conductive layer CL2.

The second active pattern ACT2 may be a channel area of the second transistor T2 as an area overlapping the second gate electrode GE2.

One end (or first end) of the second active pattern ACT2 may be electrically connected to the second source area SA2, and the other end (or second end) thereof may be electrically connected to the second drain area DA2.

The second source area SA2 may be electrically connected to the second active pattern ACT2. Furthermore, the second source area SA2 may be electrically connected to the data line Dj through a sixth connection pattern CNP6.

The sixth connection pattern CNP6 may be electrically connected to the second source area SA2 through an eleventh contact hole CH11, and be electrically connected to the data line Dj through a twelfth contact hole CH12. The sixth connection pattern CNP6 may be formed of the fifth conductive layer CL5.

The second drain area DA2 may be electrically connected to the second active pattern ACT2, the first source area SA1, and the fifth drain area DA5.

The third transistor T3 may include a third gate electrode GE3, a third active pattern ACT3, a third source area SA3, and a third drain area DA3. The third active pattern ACT3, the third source area SA3, and the third drain area DA3 may be formed of the second semiconductor pattern SCP2 formed of an oxide semiconductor. In this case, the third transistor T3 may be formed of an oxide transistor.

As illustrated in FIG. 10, the third gate electrode GE3 may be integral with the second scan line S2$i$. The third gate electrode GE3 may be formed of the fourth conductive layer CL4.

The third active pattern ACT3 may correspond to a channel area of the third transistor T3 as an area overlapping the third gate electrode GE3.

One end (or first end) of the third active pattern ACT3 may be electrically connected to the third source area SA3, and the other end (or second end) thereof may be electrically connected to the third drain area DA3.

The third source area SA3 may be electrically connected to the third active pattern ACT3. Furthermore, the third source area SA3 may be electrically connected to the first drain area DA1 and the sixth source area SA6.

The third drain area DA3 may be electrically connected to the third active pattern ACT3. Furthermore, the third drain area DA3 may be electrically connected to the first gate electrode GE1 and the fourth source area SA4.

The fourth transistor T4 may include a fourth gate electrode GE4, a fourth active pattern ACT4, a fourth source area SA4, and a fourth drain area DA4. The fourth active pattern ACT4, the fourth source area SA4, and the fourth drain area DA4 may be formed of the second semiconductor pattern SCP2. The second semiconductor pattern SCP2 may include an oxide semiconductor. In this case, the fourth transistor T4 may be formed of an oxide transistor.

As illustrated in FIG. 10, the fourth gate electrode GE4 may be integral with the third scan line S3i. The fourth gate electrode GE4 may be formed of the fourth conductive layer CL4.

The fourth active pattern ACT4 may be a channel area of the fourth transistor T4 as an area overlapping the fourth gate electrode GE4.

One end (or first end) of the fourth active pattern ACT4 may be electrically connected to the fourth source area SA4, and the other end (or second end) thereof may be electrically connected to the fourth drain area DA4.

The fourth source area SA4 may be electrically connected to the fourth active pattern ACT4. Furthermore, the fourth source area SA4 may be electrically connected to the first gate electrode GE1 and the third drain area DA3.

The fourth drain area DA4 may be electrically connected to the fourth active pattern ACT4. Furthermore, the fourth drain area DA4 may be electrically connected to the first initialization power line IPL1 through a first connection pattern CNP1.

As illustrated in FIGS. 10 and 11, the first connection pattern CNP1 may be electrically connected to the fourth drain area DA4 through a first contact hole CH1, and be electrically connected to the first initialization power line IPL1 through a fourth contact hole CH4. The first connection pattern CNP1 may be formed of the fifth conductive layer CL5.

Although there has been described that the third and fourth transistors T3 and T4 each are formed of an oxide transistor, the disclosure is not limited thereto. In an embodiment, the third and fourth transistors T3 and T4 each may be formed of a polysilicon transistor.

The fifth transistor T5 may include a fifth gate electrode GE5, a fifth active pattern ACT5, a fifth source area SA5, and a fifth drain area DA5.

As illustrated in FIG. 9, the fifth gate electrode GE5 may be integral with the emission control line Ei. The fifth gate electrode GE5 may be formed of the second conductive layer CL2.

The fifth active pattern ACT5, the fifth source area SA5, and the fifth drain area DA5 may be formed of the first semiconductor pattern SCP1 made of polysilicon.

The fifth active pattern ACT5 may be a channel area of the fifth transistor T5 as an area overlapping the fifth gate electrode GE5.

One end (or first end) of the fifth active pattern ACT5 may be electrically connected to the fifth source area SA5, and the other end (or second end) thereof may be electrically connected to the fifth drain area DA5.

The fifth source area SA5 may be electrically connected to the fifth active pattern ACT5. Furthermore, the fifth source area SA5 may be electrically connected to the second power line PL2 through a second connection pattern CNP2.

As illustrated in FIG. 11, the second connection pattern CNP2 may be electrically connected to the fifth source area SA5 through a sixth contact hole CH6. As illustrated in FIG. 12, the second connection pattern CNP2 may be electrically connected to the second power line PL2 through a thirteenth contact hole CH13. The second connection pattern CNP2 may be formed of the fifth conductive layer CL5.

The sixth transistor T6 may include a sixth gate electrode GE6, a sixth active pattern ACT6, the sixth source area SA6, and a sixth drain area DA6.

As illustrated in FIG. 9, the sixth gate electrode GE6 may be integral with the emission control line Ei. The sixth gate electrode GE6 may be formed of the second conductive layer CL2.

The sixth active pattern ACT6, the sixth source area SA6, and the sixth drain area DA6 may be formed of the first semiconductor pattern SCP1 made of polysilicon.

The sixth active pattern ACT6 may be a channel area of the sixth transistor T6 as an area overlapping the sixth gate electrode GE6.

One end (or first end) of the sixth active pattern ACT6 may be electrically connected to the sixth source area SA6, and the other end (or second end) thereof may be electrically connected to the sixth drain area DA6.

The sixth source area SA6 may be electrically connected to the sixth active pattern ACT6. Furthermore, the sixth source area SA6 may be electrically connected to the first drain area DA1 and the third source area SA3.

The sixth drain area DA6 may be electrically connected to the sixth active pattern ACT6. Furthermore, the sixth drain area DA6 may be electrically connected to a seventh source area SA7 of the seventh transistor T7 of the first pixel PXL1.

The seventh transistor T7 may include a seventh gate electrode GE7, a seventh active pattern ACT7, a seventh source area SA7, and a seventh drain area DA7.

As illustrated in FIG. 9, the seventh gate electrode GE7 may be integral with the first scan line S1i (or the fourth scan line S4i). The seventh gate electrode GE7 may be formed of the second conductive layer CL2.

The seventh active pattern ACT7, the seventh source area SA7, and the seventh drain area DA7 may be formed of the first semiconductor pattern SCP1 made of polysilicon.

The seventh active pattern ACT7 may be a channel area of the seventh transistor T7 as an area overlapping the seventh gate electrode GE7.

One end (or first end) of the seventh active pattern ACT7 may be electrically connected to the seventh source area SA7, and the other end (or second end) thereof may be electrically connected to the seventh drain area DA7.

The seventh source area SA7 may be electrically connected to the seventh active pattern ACT7. Furthermore, the seventh source area SA7 may be electrically connected to the sixth drain area DA6 of the sixth transistor T6 of an adjacent pixel PXL disposed in a pixel row subsequent to the second pixel PXL2.

The seventh drain area DA7 may be electrically connected to the seventh active pattern ACT7. Furthermore, the seventh drain area DA7 may be electrically connected to the second initialization power line IPL2 through a third contact hole CH3. The second initialization power line IPL2 may be formed of the fifth conductive layer CL5.

The storage capacitor Cst may include an upper electrode UE and a lower electrode LE.

The lower electrode LE may be provided and/or formed to be integral with the first gate electrode GE1 of the first transistor T1. For example, the lower electrode LE may be regarded as an area of the first gate electrode GE1, or the first gate electrode GE1 may be regarded as an area of the lower electrode LE.

As illustrated in FIGS. 7 and 10, the upper electrode UE may cross over an intermediate area (or a central portion) of the second pixel area PXA2 and be disposed between the emission control line Ei and the second scan line S2i in a plan view. The upper electrode UE may be formed of the third conductive layer CL3 provided and/or formed on the first interlayer insulating layer ILD1. The upper electrode UE and the second and third auxiliary bottom lines BML2i and BML3i may include a same material and be formed by a same process. As illustrated in FIG. 13, the upper electrode UE may be disposed to overlap the lower electrode LE (or the first gate electrode GE1) with the first interlayer insulating layer ILD1 interposed therebetween. In the embodiment, the lower electrode LE (or the first gate electrode GE1) may become a first electrode of the storage capacitor Cst, and the upper electrode UE may become a second electrode of the storage capacitor Cst. The first interlayer insulating layer ILD1 interposed between the lower electrode LE (or the first gate electrode GE1) and the upper electrode UE may become a dielectric of the storage capacitor Cst. The upper electrode UE may be provided in common to the second pixel PXL2 and pixels PXL adjacent to the second pixel PXL2 in the first direction DR1. A voltage of the first driving power supply VDD may be applied to the upper electrode UE. For example, the upper electrode UE may form, along with the first auxiliary bottom line BML1 (or the first power line PL1) and the second power line PL2, an additional power line APL to which the voltage of the first driving power supply VDD is to be applied.

As illustrated in FIG. 13, the upper electrode UE may be disposed on the first interlayer insulating layer ILD1 to overlap the lower electrode LE (or the first gate electrode GE1) rather than overlapping the conductive pattern CP.

The additional capacitor Cad may include an additional conductive pattern ACP and a conductive pattern CP.

The additional conductive pattern ACP may be provided and/or formed to be integral with the first auxiliary bottom line BML1 and be formed of the first conductive layer CL1. For example, the additional conductive pattern ACP may be regarded as an area of the first auxiliary bottom line BML1. Hence, a voltage of the first driving power supply VDD that is applied to the first auxiliary bottom line BML1 (or the first power line PL1) may be applied to the additional conductive pattern ACP.

The conductive pattern CP may be provided in the form of an island in the second pixel area PXA2, as illustrated in FIGS. 7 and 9, and may be disposed between the emission control line Ei and the first gate electrode GE1 (or the lower electrode LE) in a plan view. In an embodiment, the conductive pattern CP may be disposed at a position spaced apart from the first gate electrode GE1 (or the lower electrode LE). As illustrated in FIG. 13, the conductive pattern CP may be formed of the second conductive layer CL2 provided and/or formed on the first gate insulating layer GI1. The conductive pattern CP and the first gate electrode GE1 (or the lower electrode LE) may include a same material and be formed by a same process. The conductive pattern CP may be disposed to overlap the additional conductive pattern ACP with the first gate insulating layer GI1 and the first buffer layer BFL1 interposed therebetween. In an embodiment, the additional conductive pattern ACP may become a first electrode of the additional capacitor Cad, and the conductive pattern CP may become a second electrode of the additional capacitor Cad. The first gate insulating layer GI1 and the first buffer layer BFL1 that are interposed between the additional conductive pattern ACP and the conductive pattern CP may become a dielectric of the additional capacitor Cad.

The conductive pattern CP may be electrically connected to the first electrode EL1 by a third connection pattern CNP3.

The third connection pattern CNP3 may be electrically connected to the conductive pattern CP through a seventh contact hole CH7, and be electrically connected to the sixth drain area DA6 through a fifth contact hole CH5. Furthermore, the third connection pattern CNP3 may be electrically connected to a bridge pattern BRP through a fourteenth contact hole CH14. The third connection pattern CNP3 may be formed of the fifth conductive layer CL5 provided and/or formed on the second interlayer insulating layer ILD2. For example, the third connection pattern CNP3 and the second initialization power line IPL2 may include a same material and be formed by a same process.

The bridge pattern BRP may be formed of the sixth conductive layer CL6 provided and/or formed on the first via layer VIA1. For example, the bridge pattern BRP, and the data line Dj and the second power line PL2 may include a same material, and be formed by a same process. The bridge pattern BRP may be disposed at a position spaced apart from the data line Dj and the second power line PL2. The bridge pattern BRP may be electrically connected to the first electrode EL1 through a fifteenth contact hole CH15, as illustrated in FIG. 12.

The first electrode EL1 may be provided and/or formed on the pixel circuit layer PCL. For example, the first electrode EL1 may be formed of the seventh conductive layer CL7 provided and/or formed on the second via layer VIA2 of the pixel circuit layer PCL. The first electrode EL1 may correspond to the first electrode EL1 described with reference to FIG. 5, and may be an anode. In an embodiment, the first electrode EL1 may be electrically connected to one of the first and second ends EP1 and EP2 of the light emitting element LD.

The first electrode EL1 may be formed of conductive material (or substance) having a reflectivity (e.g., a predetermined or selected reflectivity) to allow light emitted from the light emitting element LD to travel in an image display direction (or a frontal direction) of the display device DD. The conductive material may include opaque metal that has an advantage in reflecting, in the image display direction (or a target direction) of the display device DD, light emitted from the light emitting element LD. For example, the opaque metal may include metal such as copper (Cu), silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In an embodiment, the first electrode EL1 may include a transparent conductive material (or substance). The transparent conductive material (or substance) may include a transparent conductive oxides such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). In case that the first electrode EL1 includes a transparent conductive material (or substance), a separate conductive layer formed of opaque metal for reflecting light emitted from the light emitting element LD in the image display direction of the display device DD may be added. However, the material of the first electrode EL1 is not limited to the foregoing materials.

The first electrode EL1 may be provided and/or formed to have a single-layer structure, but the disclosure is not limited thereto. In an embodiment, the first electrode EL1 may be provided and/or formed in a multi-layer structure formed by stacking at least two materials among metals, alloys, conductive oxides, and conductive polymers. The first electrode EL1 may be formed of a multi-layer structure including at least two layers to minimize distortion resulting from a signal delay in case that a signal (or a voltage) is transmitted to the light emitting element LD.

The first electrode EL1 may be used as a bonding electrode which is bonded to the light emitting element LD. The first electrode EL1 may be used as a medium which is bonded to the bonding electrode of the light emitting element LD to electrically connect some components of the pixel circuit layer PCL to the light emitting element LD. For example, the first electrode EL1 may be a medium which electrically connects the light emitting element LD to the sixth transistor T6.

As described above, the conductive pattern CP may be electrically connected to the first electrode EL1 through the fifth and seventh contact holes CH5 and CH7, the third connection pattern CNP3, the fourteenth and fifteenth contact holes CH14 and CH15, and the bridge pattern BRP. Hence, a signal (or a voltage) to be transmitted to the first electrode EL1 may be applied to the conductive pattern CP provided in the form of an island.

As the light emitting element LD is connected to the additional capacitor Cad formed both by the additional conductive pattern ACP to which a constant fixed voltage (e.g., a voltage of the first driving power supply VDD) is to be applied and by the conductive pattern CP to which a signal of the first electrode EL1 is to be applied, leakage current may be prevented from being drawn into the light emitting element LD, so that a malfunction and/or emission error of the light emitting element LD may be reduced or prevented from occurring. The capacitance of the additional capacitor Cad may be increased by increasing a surface area in which the additional conductive pattern ACP and the conductive pattern CP overlap each other. In an embodiment, the shape and/or surface area (or size), etc. of the additional capacitor Cad may be changed in various ways within a range in which the change neither affect the operation of the light emitting element LD nor exert electrical and/or physical influence on adjacent circuit elements (e.g., transistors and signal lines)

Hereinafter, the light emitting element LD bonded to the first electrode EL1, and the second electrode EL2 electrically connected to the light emitting element LD will be described with reference to FIG. 14.

Figure 14:
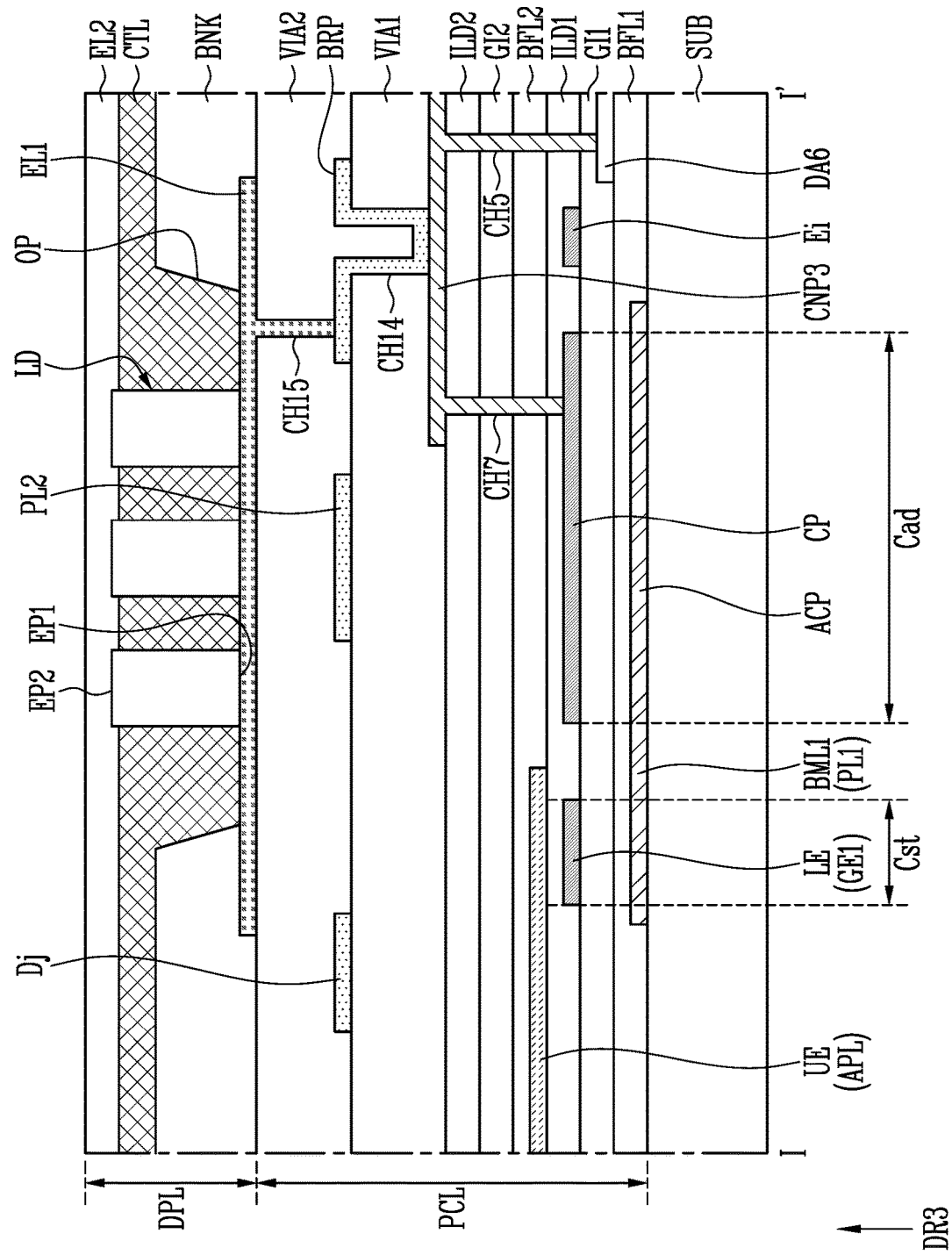
FIG. 14 schematically illustrates the second pixel of FIG. 7 including light emitting elements, and is a schematic cross-sectional view corresponding to line I-I' of FIG. 7.

FIG. 14 schematically illustrates the second pixel PXL2 of FIG. 7 including the light emitting element LD, and is a schematic cross-sectional view corresponding to line I-I' of FIG. 7.

With regard to the embodiment of FIG. 14, the following description will be focused on differences from that of the foregoing embodiments to avoid repetitive descriptions.

Referring to FIGS. 5 to 14, the second pixel PXL2 may include a display element layer DPL disposed on a pixel circuit layer PCL.

The display element layer DPL may include a bank BNK, an intermediate layer CTL, at least one light emitting element LD, and a second electrode EL2.

The bank BNK may be provided and/or formed on the first electrode EL1.

The bank BNK may form a pixel defining layer which defines the emission area of the second pixel PXL2. The bank BNK may be partially open to include an opening OP which exposes an area of the first electrode EL1. The emission area of the second pixel PXL2 and the opening OP of the bank BNK may correspond to each other.

The bank BNK may include at least one light block material and/or at least one reflective material (or scattering material), thus preventing light (or rays) from leaking between the second pixel PXL2 and the pixels PXL adjacent thereto. In an embodiment, the bank BNK may be formed of an organic insulating layer including an organic material. For example, the bank BNK may be formed of an organic insulating layer made of material such as acryl resin, epoxy resin, phenolic resin, polyamide resin, or polyimide resin. Furthermore, in an embodiment, the bank BNK may include a transparent material. The transparent material may include, for example, polyamides resin, polyimides resin, etc., but the disclosure is not limited thereto. In an embodiment, in order to enhance the efficiency of light emitted from the second pixel PXL2, a separate reflective layer may be provided and/or formed on the bank BNK.

The intermediate layer CTL may be applied to the overall surfaces of the bank BNK and the exposed first electrode EL1 by a spin coating method or the like. In an embodiment, the intermediate layer CTL may be provided on the bank BNK and the first electrode EL1 to fill the opening OP.

The intermediate layer CTL may be an organic layer including an organic material to stably fix the light emitting element LD and reinforce adhesive force between the light emitting element LD and the first electrode EL1. For example, the intermediate layer CTL may be a transparent adhesive layer (or bonding layer), but the disclosure is not limited thereto. In an embodiment, the intermediate layer CTL may be a refractive index conversion layer configured to change the refractive index of light emitted from the light emitting element LD and traveling in the image display direction, thereby enhancing the light output luminance of the second pixel PXL2.

In an embodiment, the intermediate layer CTL may be formed of an organic material. The organic material may include, e.g., at least one of photopolymer resin which includes a photopolymerization initiator and is cross-linked and cured by light such as ultraviolet (UV) light, and thermosetting polymer resin including a thermal polymerization initiator which initiates a curing reaction by heat. For example, the thermosetting polymer resin may include epoxy resin, amino resin, phenol resin, polyester resin, etc. which are formed of organic material. The intermediate layer CTL may be cured by light or heat during a process of bonding the light emitting element LD and the first electrode EL1 to each other. Hence, the intermediate layer CTL may stably fix the light emitting element LD and prevent the light emitting element LD from being removed from the fixed position.

The light emitting element LD may be provided and/or positioned on the intermediate layer CTL. In an embodiment, the second pixel PXL2 may include at least one light emitting element LD. The light emitting element LD may include the light emitting element LD described with reference to FIGS. 6B and 6C. The light emitting element LD may be a vertical light emitting diode in which the second semiconductor layer 13, the active layer 12, and the first semiconductor layer 11 are sequentially stacked in the third direction DR3 (e.g., in the order listed), and which has a diameter D and/or a length L to a degree of the micrometer scale. The second semiconductor layer 13 may be disposed on the first end EP1 of the light emitting element LD. The first semiconductor layer 11 may be disposed on the second end EP2 of the light emitting element LD. Although not directly illustrated in the drawings, the light emitting element LD may further include a bonding electrode which is disposed on the second semiconductor layer 13 to contact the first electrode EL1 so that the bonding electrode may be bonded to the first electrode EL1.

The bonding electrode of the light emitting element LD may directly contact the first electrode EL1 to thus be bonded to the first electrode EL1. The first semiconductor layer 11 of the light emitting element LD may directly contact the second electrode EL2 to thus be electrically connected to the second electrode EL2.

The light emitting element LD that has been transferred to a transfer substrate by a transportation device may be moved to over an upper portion of the intermediate layer CTL to correspond to the opening OP of the bank BNK and be retransferred into the opening OP. During the foregoing process, the intermediate layer CTL formed of a fluidic organic layer and filling the opening OP may be moved so that the bonding electrode (or the first end EP1) of the light emitting element LD may directly contact the first electrode EL1.

A bonding method may be used to electrically connect the light emitting element LD to the first electrode EL1. An appropriate bonding method selected from among an anisotropic conductive film (ACF) bonding method, a laser assist bonding (LAB) method, an ultrasonic bonding method, a ball grid array (BGA) bonding method, and a thermo compression (TC) bonding method may be used as the bonding method. The TC bonding method may refer to a method in which the bonding electrode of the light emitting element LD and the first electrode EL1 contact each other and are heated to a temperature higher than the melting points of the bonding electrode and the first electrode EL1 and compressed so that the bonding electrode and the first electrode EL1 may be electrically and/or physically connected to each other.

As described above, after the bonding electrode of the light emitting element LD in the opening OP contacts the first electrode EL1, the light emitting element LD and the first electrode EL1 may be electrically connected to each other by performing the bonding process using the TC bonding method. If heat and pressure are applied to the bonding electrode of the light emitting element LD to bond the bonding electrode and the first electrode EL1 to each other, an intermetallic compound may be generated and grown between the bonding electrode and the first electrode EL1. The light emitting element LD and the first electrode EL1 may be electrically and/or physically connected to each other by the intermetallic compound.

The second electrode EL2 may be provided and/or formed on the light emitting element LD bonded to the first electrode EL1.

The second electrode EL2 may be formed on the overall surfaces of the second end EP2 of the light emitting element LD and the intermediate layer CTL. The second electrode EL2 may contact the second end EP2 of the light emitting element LD and be electrically connected to the second end EP2 of the light emitting element LD. For example, the second electrode EL2 may be electrically connected to the first semiconductor layer 11 disposed on the second end EP2 of the light emitting element LD.

The second electrode EL2 may be formed of various transparent conductive materials to enable light emitted from the light emitting element LD to travel in the image display direction without loss. For example, the second electrode EL2 may include at least one of various transparent conductive materials (or substances) including indium tin oxide (ITO), indium zinc oxide (IZO), zinc oxide ($ZnO_x$), indium gallium zinc oxide (IGZO), and indium tin zinc oxide (ITZO), and be substantially transparent or translucent to satisfy a transmittancy (or transmittance). However, the material of the second electrode EL2 is not limited to the foregoing embodiment.

The second electrode EL2 may be electrically connected to the second driving voltage line DVL2 in the non-display area NDA of the substrate SUB. Hence, a voltage of the second driving power supply VSS may be applied to the second electrode EL2. In an embodiment, the second electrode EL2 may be a cathode.

In an embodiment, as illustrated in FIG. 4, the encapsulation layer ENL may be provided and/or formed on the second electrode EL2.

The encapsulation layer ENL may be an encapsulation substrate or an encapsulation film having a multi-layer structure. In this case, the encapsulation layer ENL may prevent external oxygen or water from permeating the display element layer DPL or the pixel circuit layer PCL. In an embodiment, the encapsulation layer ENL may be a planarization layer for mitigating a step difference (or height or thickness difference) caused by components disposed thereunder.

Figure 15:
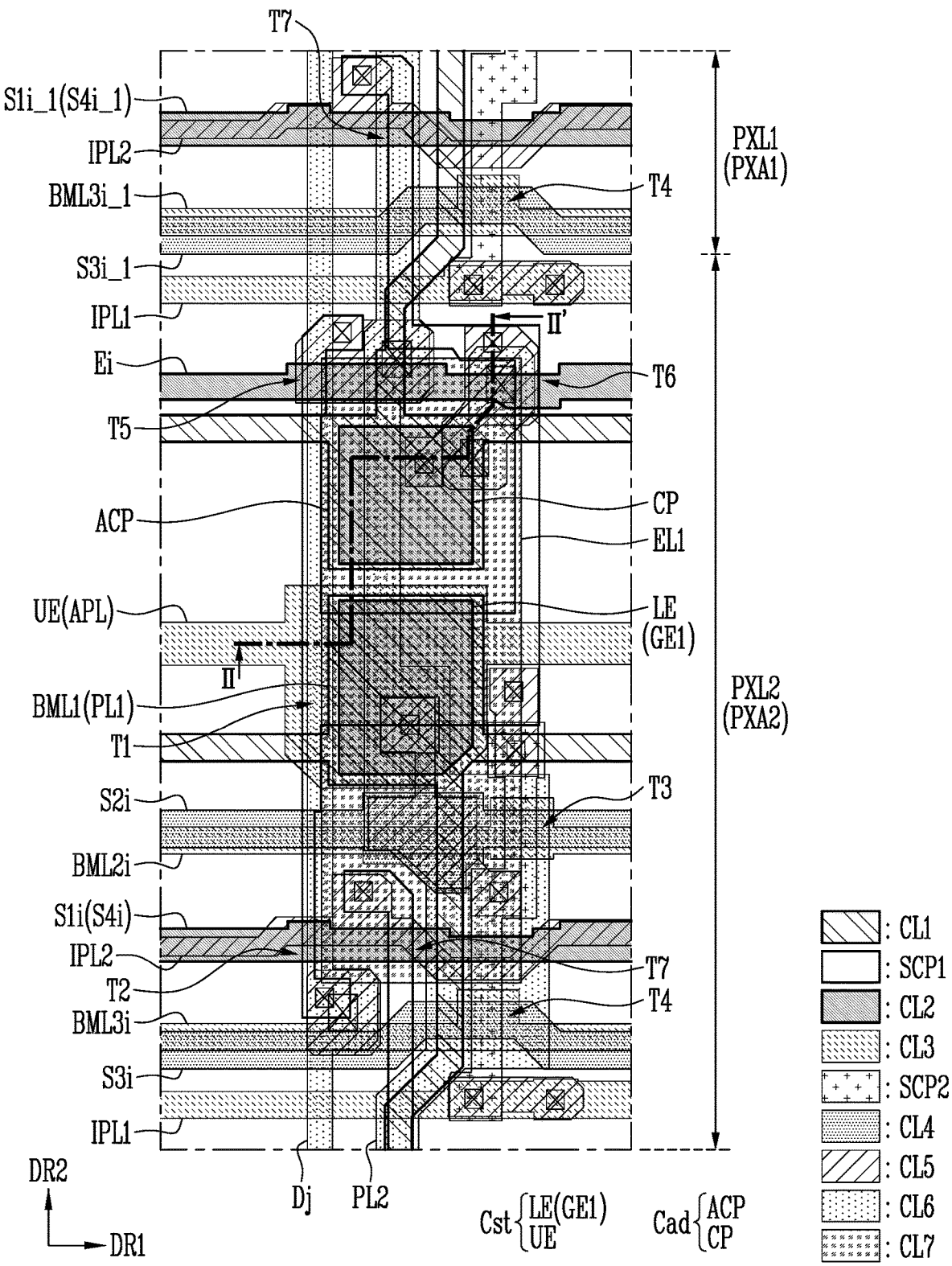
FIG. 15 is a plan view schematically illustrating a first pixel and a second pixel adjacent to the first pixel, in accordance with an embodiment of the disclosure.
Figure 16:
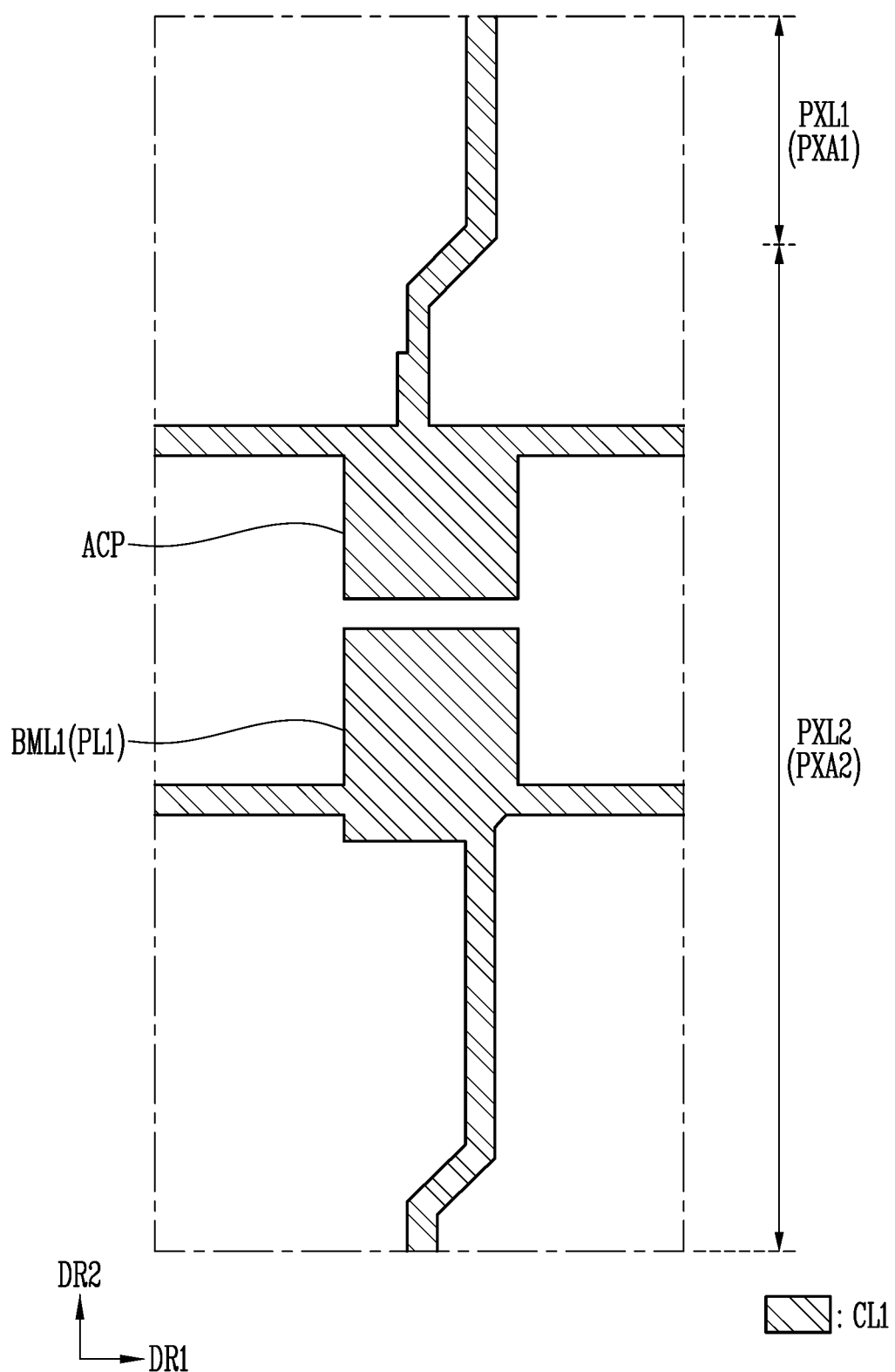
FIG. 16 is a schematic plan view illustrating an example of a first conductive layer of FIG. 15.
Figure 17:
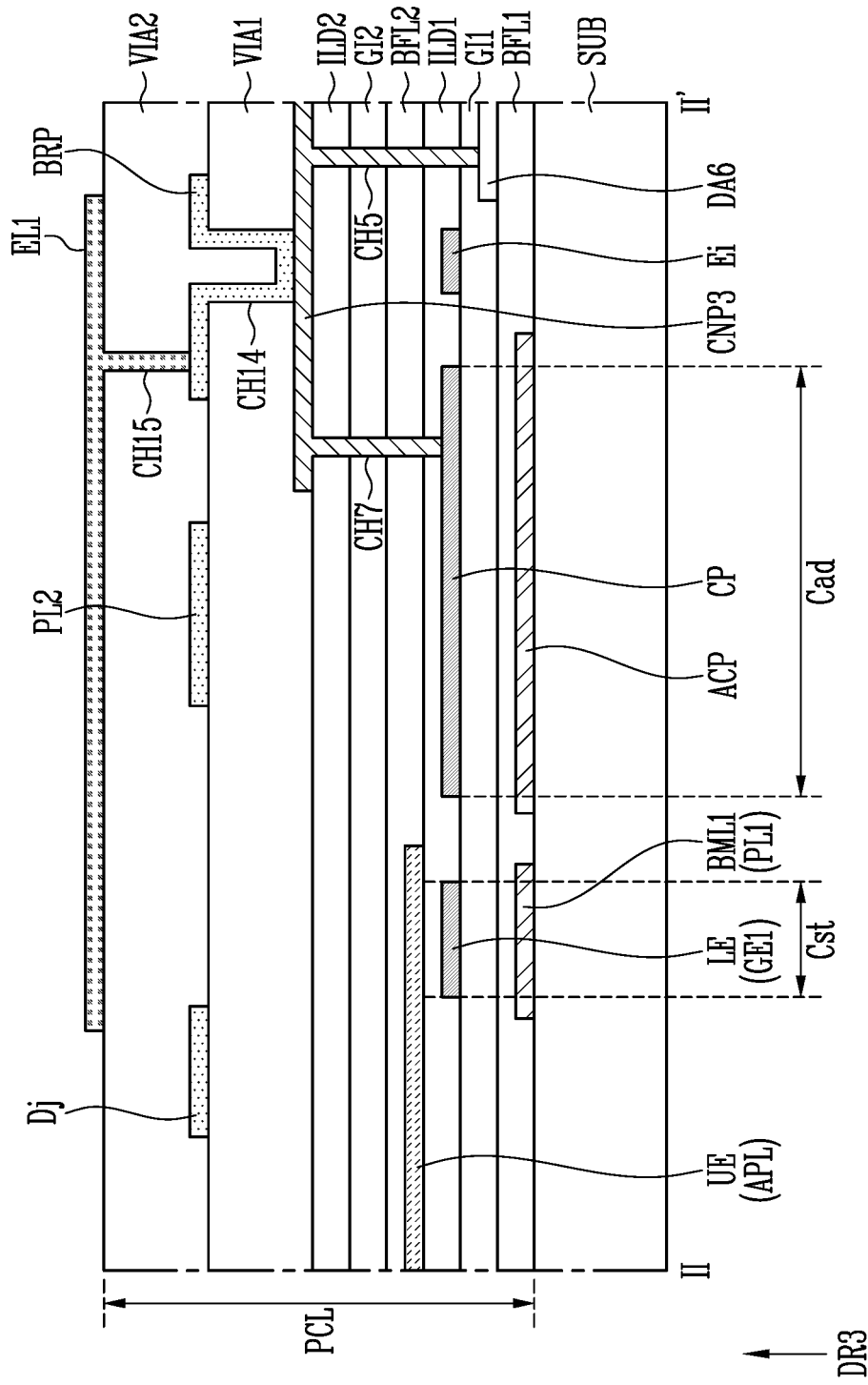
FIG. 17 is a schematic cross-sectional view taken along line II-II' of FIG. 15.

FIG. 15 is a plan view schematically illustrating a first pixel PXL1 and a second pixel PXL2 adjacent to the first pixel PXL1, in accordance with an embodiment of the disclosure. FIG. 16 is a schematic plan view illustrating an example of a first conductive layer CL1 of FIG. 15. FIG. 17 is a schematic cross-sectional view taken along line II-II' of FIG. 15.

The first and second pixels PXL1 and PXL2 illustrated in FIGS. 15 to 17, other than the fact that an additional conductive pattern ACP provided in the second pixel PXL2 and a first auxiliary bottom line BML1 are spaced apart from each other rather than being integrally provided, may have a configuration substantially equal or similar to that of the first and second pixels PXL1 and PXL2 of FIGS. 7 to 13.

Hereinafter, the following description with reference to FIGS. 15 to 17 will be focused on differences from that of the foregoing embodiments to avoid repetitive descriptions.

Referring to FIGS. 15 to 17, the second pixel PXL2 may include the additional conductive pattern ACP and the first auxiliary bottom line BML1 which are formed of the first conductive layer CL1.

The first auxiliary bottom line BML1 may be formed of the first conductive layer CL1 provided and/or formed on the substrate SUB. A voltage of the first driving power supply VDD (see FIG. 5) may be applied to the first auxiliary bottom line BML1. The first auxiliary bottom line BML1 may correspond to the lower electrode LE (or the first gate electrode GE1). For example, the first auxiliary bottom line BML1 may overlap the lower electrode LE (or the first gate electrode GE1) with the first gate insulating layer GI1 and the first buffer layer BFL1 interposed therebetween. The first auxiliary bottom line BML1 may be provided in common to the second pixel PXL2 and pixels PXL (see FIG. 3) adjacent to the second pixel PXL2 in the first direction DR1. The first auxiliary bottom line BML1 may be electrically connected to the second power line PL2 in the non-display area NDA (see of FIG. 3) of the substrate SUB.

As illustrated in FIG. 16, the additional conductive pattern ACP may be disposed at a position spaced apart from the first auxiliary bottom line BML1. In the second pixel area PXA2, the additional conductive pattern ACP and the first auxiliary bottom line BML1 may be spaced from each other with a distance interposed therebetween. In a plan view, the additional conductive pattern ACP may be located in an upper end, and the first auxiliary bottom line BML1 may be located in a lower end.

The additional conductive pattern ACP and the first auxiliary bottom line BML1 may include a same material and be formed by a same process. For example, the additional conductive pattern ACP may be formed of the first conductive layer CL1. The additional conductive pattern ACP may correspond to the conductive pattern CP. For example, the additional conductive pattern ACP may overlap the conductive pattern CP with the first gate insulating layer GI1 and the first buffer layer BFL1 interposed therebetween.

The additional conductive pattern ACP may be a first electrode (or an electrode) of the additional capacitor Cad.

The conductive pattern CP may be a second electrode (or the other electrode) of the additional capacitor Cad.

The additional conductive pattern ACP may be supplied with a signal (or a voltage) having a level different from that of the first auxiliary bottom line BML1. For example, the additional conductive pattern ACP may be supplied with a voltage of the second driving power supply VSS (see FIG. 5) and supplied with a first initialization voltage VINT1 (see FIG. 5) or a second initialization voltage VINT2 (see FIG. 5). However, the disclosure is not limited the foregoing embodiment, and the additional conductive pattern ACP may be applied with another voltage having a fixed level (or a fixed voltage).

As the light emitting element LD is connected to the additional capacitor Cad formed both by the additional conductive pattern ACP to which a constant fixed voltage is to be applied and by the conductive pattern CP to which a signal of the first electrode EL1 is to be applied, leakage current may be prevented from being drawn into the light emitting element LD, so that a malfunction and/or emission error of the light emitting element LD may be reduced or prevented from occurring.

Figure 18:
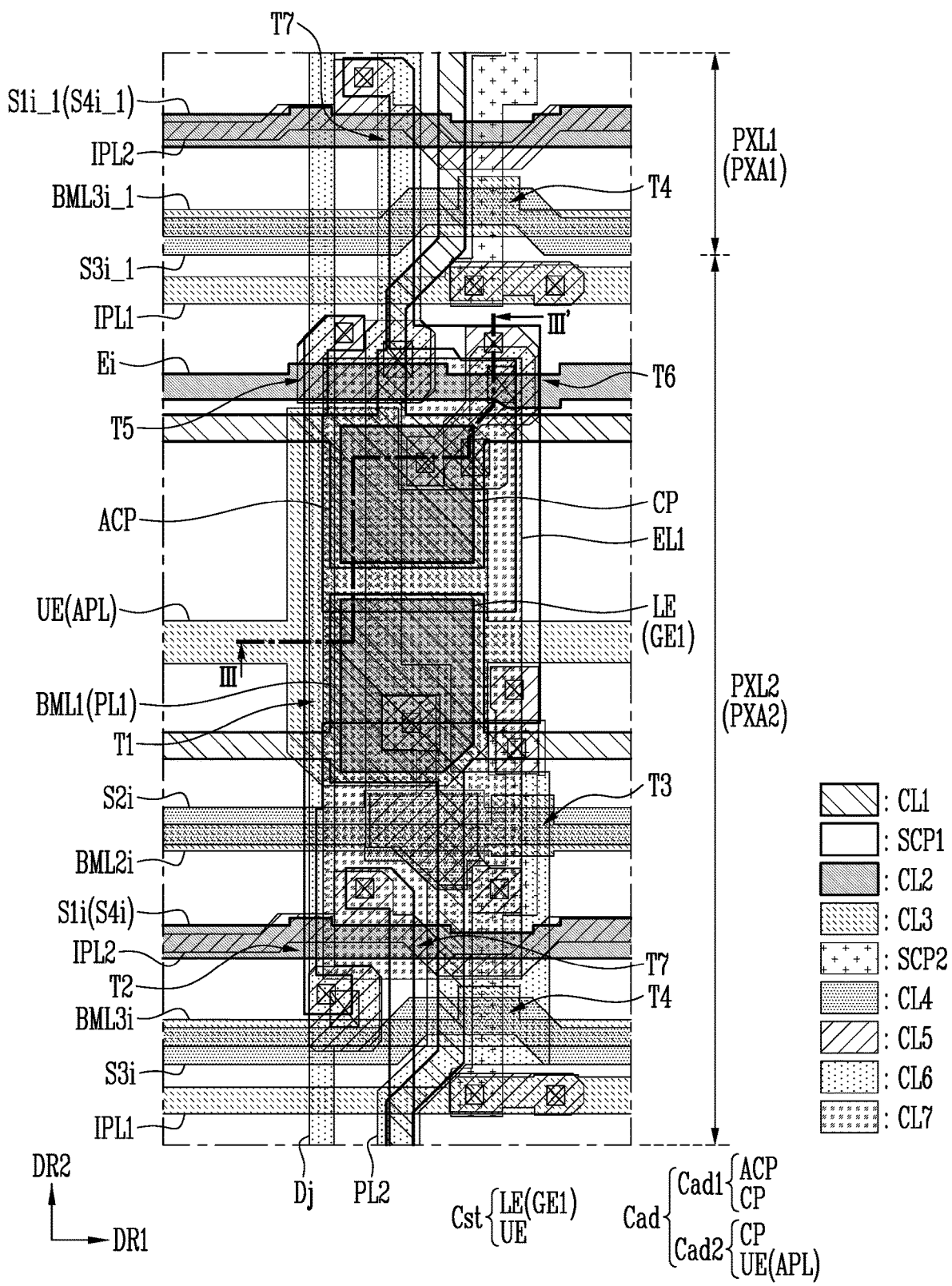
FIG. 18 is a plan view schematically illustrating a first pixel and a second pixel adjacent to the first pixel, in accordance with an embodiment of the disclosure.
Figure 19:
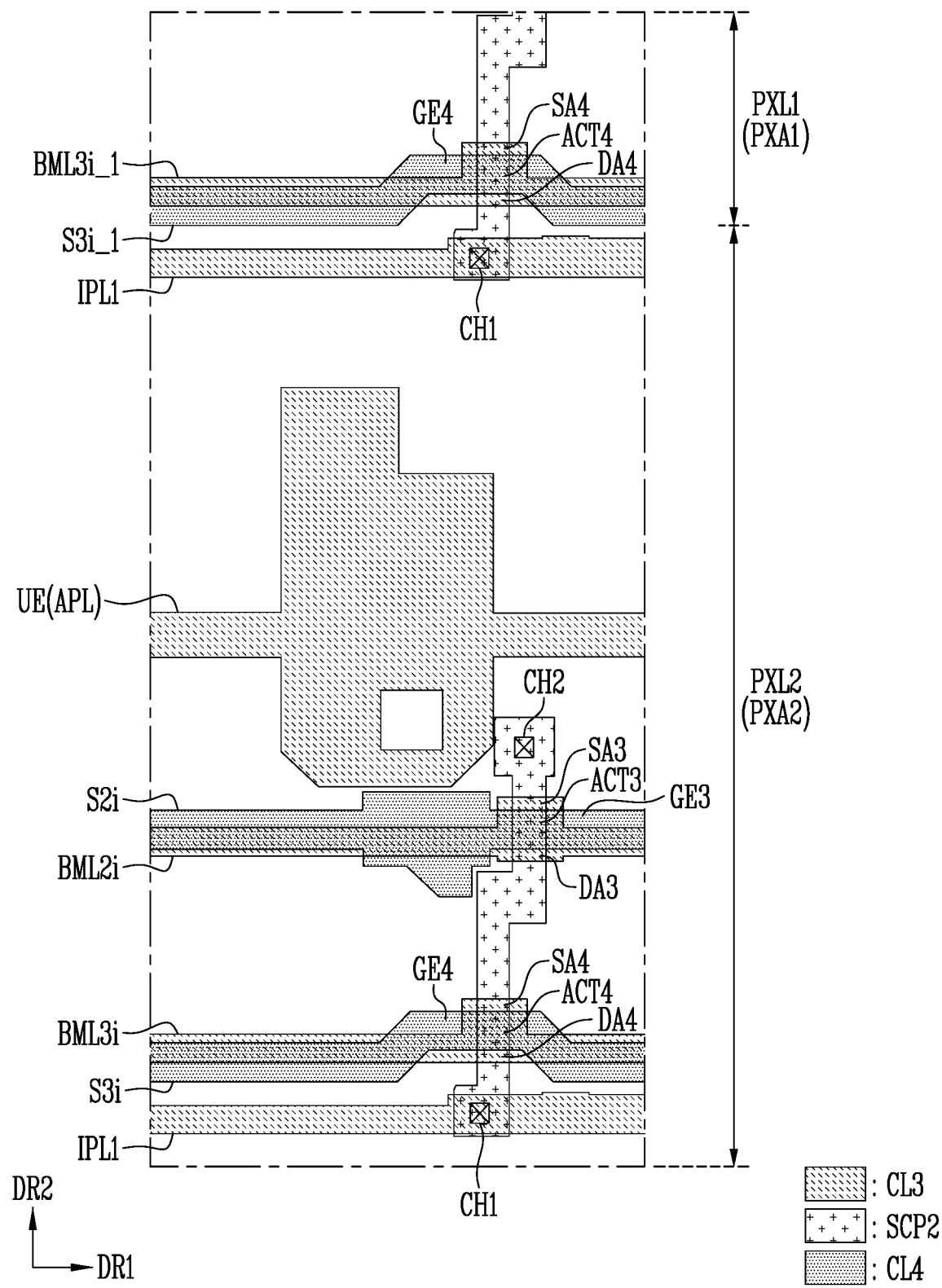
FIG. 19 is a schematic plan view illustrating examples of a third conductive layer, a second semiconductor pattern, and a fourth conductive layer of FIG. 18.
Figure 20:
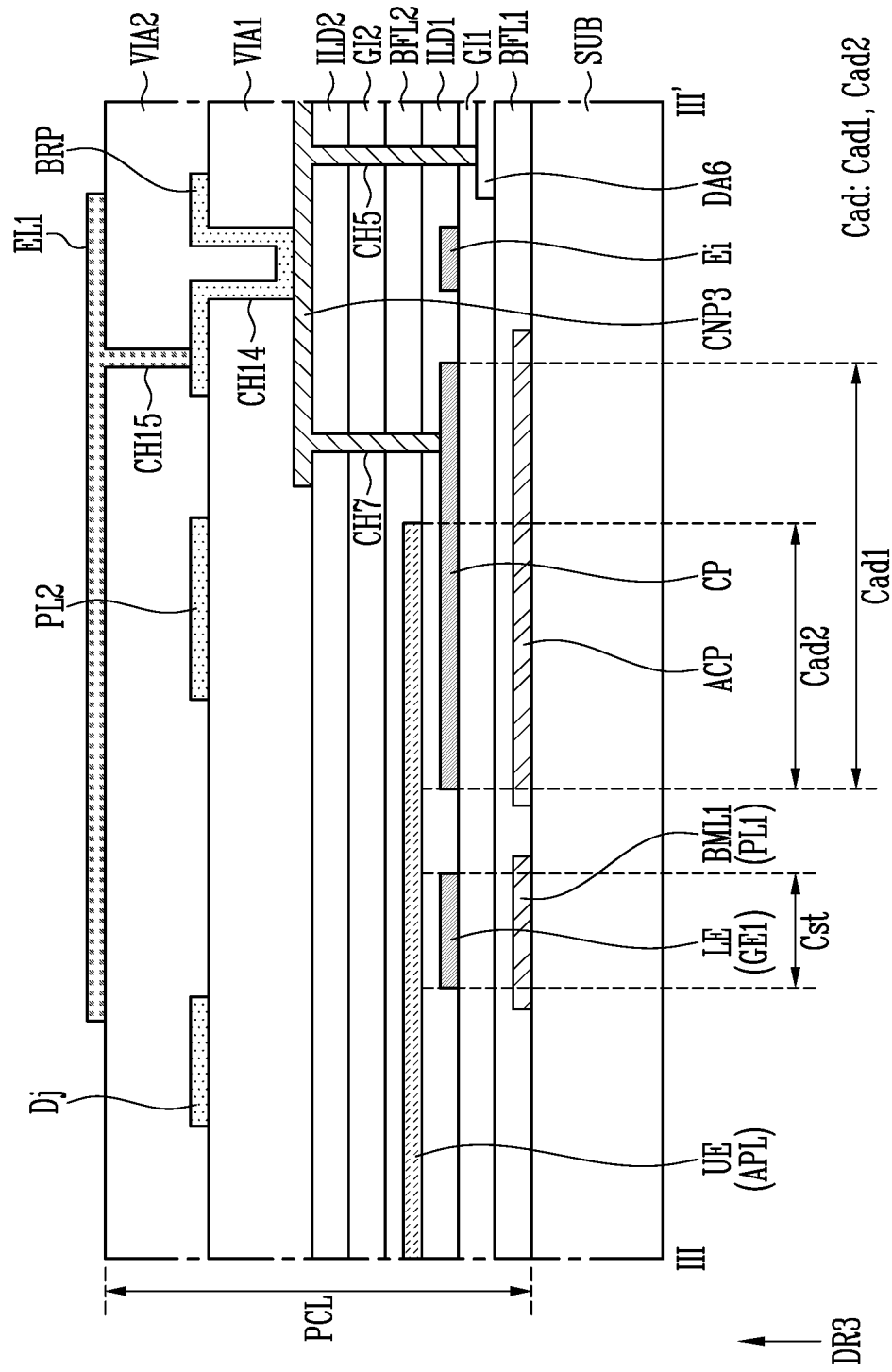
FIG. 20 is a schematic cross-sectional view taken along line III-III' of FIG. 18.

FIG. 18 is a plan view schematically illustrating a first pixel PXL1 and a second pixel PXL2 adjacent to the first pixel PXL1, in accordance with an embodiment of the disclosure. FIG. 19 is a schematic plan view illustrating examples of a third conductive layer CL3, a second semiconductor pattern SCP2, and a fourth conductive layer CL4 of FIG. 18. FIG. 20 is a schematic cross-sectional view taken along line III-III' of FIG. 18.

The first and second pixels PXL1 and PXL2 illustrated in FIGS. 18 to 20, other than the fact that an upper electrode UE provided in the second pixel PXL2 expands and overlaps the conductive pattern CP, may have a configuration substantially equal or similar to that of the first and second pixels PXL1 and PXL2 of FIGS. 15 to 17.

Hereinafter, the following description with reference to FIGS. 18 to 20 will be focused on differences from that of the foregoing embodiments to avoid repetitive descriptions.

Referring to FIGS. 18 to 20, the second pixel PXL2 may include the upper electrode UE formed of the third conductive layer CL3.

As illustrated in FIG. 19, the upper electrode UE may include an extension extending from an intermediate area (or a central portion) of the second pixel area PXA2 in the second direction DR2. The extension may overlap the additional conductive pattern ACP and the conductive pattern CP. The upper electrode UE may be formed of the third conductive layer CL3 provided and/or formed on the first interlayer insulating layer ILD1.

In an embodiment, the upper electrode UE may include a first area which overlaps the first auxiliary bottom line BML1 and the lower electrode LE (or the first gate electrode GE1), and a second area which overlaps the additional conductive pattern ACP and the conductive pattern CP.

The first area of the upper electrode UE may overlap the lower electrode LE (or the first gate electrode GE1) with the first interlayer insulating layer ILD1 interposed therebetween, thus forming a storage capacitor Cst along with the lower electrode LE.

The second area of the upper electrode UE may overlap the conductive pattern CP with the first interlayer insulating layer ILD1 interposed therebetween, thus forming a second additional capacitor Cad2 along with the conductive pattern CP. In other words, the second additional capacitor Cad2 may be formed of the conductive pattern CP and the second area of the upper electrode UE. In an embodiment, the conductive pattern CP may become a first electrode of the second additional capacitor Cad2, and the second area of the upper electrode UE may become a second electrode of the second additional capacitor Cad2.

In an embodiment, the conductive pattern CP may overlap the additional conductive pattern ACP with the first gate insulating layer GI1 and the first buffer layer BFL1 interposed therebetween, thus forming a first additional capacitor Cad1 along with the additional conductive pattern ACP. In other words, the first additional capacitor Cad1 may be formed of an additional conductive pattern ACP and a conductive pattern CP.

As described above, as the upper electrode UE expands and overlaps the additional conductive pattern ACP and the conductive pattern CP, the second area of the upper electrode UE that overlaps the conductive pattern CP may form the second additional capacitor Cad2 along with the conductive pattern CP, so that the additional capacitor Cad electrically connected to the light emitting element LD may have a relatively large capacitance.

In accordance with the foregoing embodiment, the additional capacitor Cad may be easily formed without using a separate additional process. The capacitance of the additional capacitor Cad may be adjusted depending on the shapes and/or disposition positions of the electrodes that are disposed over and/or under the conductive pattern CP of the additional capacitor Cad and overlap the conductive pattern CP, so that leakage current may be prevented from being drawn into the light emitting element LD, whereby a display device DD (see FIG. 1) having improved reliability may be provided.

Various embodiments of the disclosure may provide a display device which includes an additional capacitor formed both as an additional conductive pattern to which a fixed voltage is to be applied, and as a conductive pattern which overlaps the additional conductive pattern and is electrically connected to a light emitting element, so that a malfunction and/or emission error of a light emitting element which may be caused by leakage current may be reduced or minimized, whereby the reliability of the display device may be enhanced.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a first conductive layer disposed on a substrate, and including an auxiliary bottom line and an additional conductive pattern;
   a first insulating layer disposed on the substrate and the first conductive layer;
   a semiconductor pattern disposed on the first insulating layer;
   a second insulating layer disposed on the first insulating layer and the semiconductor pattern;

a second conductive layer disposed on the second insulating layer, and including a conductive pattern and a gate electrode spaced apart from each other;
a third insulating layer disposed on the second insulating layer and the second conductive layer;
a connection pattern disposed on the third insulating layer and electrically connected to the conductive pattern through a contact hole passing through the third insulating layer;
a first electrode disposed on the connection pattern and electrically connected to the connection pattern; and
at least one light emitting element disposed on the first electrode and electrically connected to the first electrode.

2. The display device according to claim 1, wherein
the conductive pattern partially overlaps the additional conductive pattern in a plan view,
the first and the second insulating layers are disposed between the conductive pattern and the additional conductive pattern, and
the conductive pattern and the additional conductive pattern form a first capacitor.

3. The display device according to claim 2, wherein
the additional conductive pattern is a first electrode of the first capacitor, and
an overlap area of the conductive pattern that overlaps the additional conductive pattern in a plan view is a second electrode of the first capacitor.

4. The display device according to claim 3, wherein a voltage is applied to the additional conductive pattern.

5. The display device according to claim 3, further comprising:
a third conductive layer including an upper electrode disposed on the third insulating layer such that the upper electrode is located on the gate electrode, wherein
the upper electrode partially overlaps the gate electrode in a plan view,
the third insulating layer is disposed between the upper electrode and the gate electrode, and
the upper electrode and the gate electrode form a storage capacitor.

6. The display device according to claim 5, wherein
the gate electrode is a first electrode of the storage capacitor, and
an overlap area of the upper electrode that overlaps the gate electrode in a plan view is a second electrode of the storage capacitor.

7. The display device according to claim 5, wherein the upper electrode does not overlap the conductive pattern in a plan view.

8. The display device according to claim 5, wherein the upper electrode partially overlaps the conductive pattern in a plan view.

9. The display device according to claim 8, wherein
the upper electrode overlaps the conductive pattern in a plan view,
the third insulating layer is disposed between the upper electrode and the conductive pattern, and
the upper electrode and the conductive pattern form a second capacitor.

10. The display device according to claim 9, wherein
the conductive pattern is a first electrode of the second capacitor, and
an overlap area of the upper electrode that overlaps the conductive pattern in a plan view is a second electrode of the second capacitor.

11. The display device according to claim 5, wherein the additional conductive pattern and the auxiliary bottom line are integral with each other.

12. The display device according to claim 5, wherein the additional conductive pattern and the auxiliary bottom line are disposed on the substrate and spaced apart from each other.

13. The display device according to claim 12, wherein
the conductive pattern corresponds to the additional conductive pattern, and
the gate electrode corresponds to the auxiliary bottom line.

14. The display device according to claim 13, wherein different voltages are respectively applied to the additional conductive pattern and the auxiliary bottom line.

15. The display device according to claim 1, further comprising:
a bank disposed on the first electrode and including an opening which exposes at least a portion of the first electrode; and
a second electrode disposed on the light emitting element and electrically connected to the light emitting element.

16. The display device according to claim 15, further comprising:
an intermediate layer disposed between the bank and the second electrode and in the opening,
wherein the intermediate layer comprises an organic layer.

17. The display device according to claim 15, wherein
the light emitting element comprises a vertical light emitting diode including a first end and a second end in a longitudinal direction,
the light emitting element comprises:
a first semiconductor layer disposed at the first end and electrically connected to the first electrode;
a second semiconductor layer disposed at the second end and electrically connected to the second electrode; and
an active layer disposed between the first semiconductor layer and the second semiconductor layer,
the first semiconductor layer comprises a p-type semiconductor layer doped with a p-type dopant, and
the second semiconductor layer comprises an n-type semiconductor layer doped with an n-type dopant.

18. A display device comprising:
pixels provided on a substrate, wherein
each of the pixels comprises:
a pixel circuit layer disposed on the substrate, and including:
at least one transistor; and
at least one power line electrically connected to the at least one transistor; and
a display element layer disposed on the pixel circuit layer, and including:
a first electrode electrically connected to each of the at least one transistor and the at least one power line; and
at least one light emitting element electrically connected to the first electrode, and
the pixel circuit layer comprises:
a first conductive layer disposed between the substrate and the at least one transistor, and including:
an auxiliary bottom line; and
an additional conductive pattern that partially overlap the at least one transistor in a plan view;
a first insulating layer disposed on the substrate and the first conductive layer;

a semiconductor pattern of the at least one transistor disposed on the first insulating layer;

a second insulating layer disposed on the first insulating layer and the semiconductor pattern of the at least one transistor;

a second conductive layer disposed on the second insulating layer, and including a conductive pattern and a gate electrode spaced apart from each other;

a third insulating layer disposed on the second insulating layer and the second conductive layer;

a connection pattern disposed on the third insulating layer and electrically connected to the conductive pattern through a contact hole passing through the third insulating layer; and a bridge pattern disposed between the connection pattern and the first electrode, and electrically connecting the connection pattern to the first electrode.

19. The display device according to claim 18, wherein the conductive pattern partially overlaps the additional conductive pattern in a plan view, the first and the second insulating layers are disposed between the conductive pattern and the additional conductive pattern, the conductive pattern and the additional conductive pattern form a capacitor, the additional conductive pattern forms a first electrode of the capacitor, and an overlap area of the conductive pattern that overlaps the additional conductive pattern in a plan view forms a second electrode of the capacitor.

20. A display device comprising:

a data line;

a scan line;

a first driving voltage line carrying a first driving power supply and a second driving voltage line carrying a second driving power supply;

an emission control line;

an auxiliary bottom line carrying a third driving power supply;

a first transistor comprising:
　a gate electrode electrically connected to a first node;
　a first electrode electrically connected to a second node;
　a second electrode electrically connected to a third node;
　a first auxiliary bottom line overlaps a channel area of the first transistor;

a second transistor comprising:
　a first electrode electrically connected to the data line;
　a second electrode electrically connected to the second node; and
　a gate electrode electrically connected to the scan line;

a first capacitor electrically connected between the first node and the first driving voltage line;

a third transistor comprising:
　a first electrode electrically connected to the third node;
　a second electrode electrically connected to a fourth node;
　a gate electrode electrically connected to the emission control line; and
　a second auxiliary bottom line is disposed below the third transistor and overlaps a channel area of the third transistor;

at least one light emitting element electrically connected between the fourth node and the second driving voltage line; and a second capacitor electrically connected between the fourth node and the auxiliary bottom line, wherein a voltage is applied to the auxiliary bottom line.

21. The display device according to claim 20, wherein the second capacitor and the at least one light emitting element are in a series connection between the auxiliary bottom line and the second driving voltage line.

* * * * *